(12) United States Patent
Moon

(10) Patent No.: US 9,099,610 B2
(45) Date of Patent: Aug. 4, 2015

(54) LIGHT EMITTING DEVICE AND LIGHT EMITTING DEVICE PACKAGE

(71) Applicant: LG INNOTEK CO., LTD., Seoul (KR)

(72) Inventor: Ji Hyung Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 146 days.

(21) Appl. No.: 13/839,680

(22) Filed: Mar. 15, 2013

(65) Prior Publication Data

US 2013/0285095 A1    Oct. 31, 2013

(30) Foreign Application Priority Data

Apr. 26, 2012   (KR) .................. 10-2012-0043643

(51) Int. Cl.
*H01L 33/02* (2010.01)
*H01L 33/22* (2010.01)
*H01L 33/24* (2010.01)
*H01L 33/32* (2010.01)

(52) U.S. Cl.
CPC .............. *H01L 33/24* (2013.01); *H01L 33/02* (2013.01); *H01L 33/22* (2013.01); *H01L 33/32* (2013.01); *H01L 2224/48091* (2013.01); *H01L 2933/0083* (2013.01)

(58) Field of Classification Search
CPC ..................................... H01L 33/24

USPC ................... 257/79, 94, 96, 98, 103
See application file for complete search history.

(56) References Cited

U.S. PATENT DOCUMENTS

2008/0035936 A1*  2/2008  Lester .............. 257/79
2008/0135856 A1   6/2008  Moon
2010/0059781 A1   3/2010  Yokobayashi et al.
2010/0289048 A1* 11/2010  Kumura ............ 257/98
2011/0186892 A1*  8/2011  Jeong ............... 257/98
2012/0007121 A1   1/2012  Lee et al.

FOREIGN PATENT DOCUMENTS

KR    10-2009-0018451 A    2/2009

* cited by examiner

*Primary Examiner* — Matthew W Such
*Assistant Examiner* — David Spalla
(74) *Attorney, Agent, or Firm* — Birch, Stewart, Kolasch & Birch, LLP

(57) ABSTRACT

Disclosed are a light emitting device and a light emitting device package. The light emitting device includes a first conductive semiconductor layer, an active layer on the first conductive semiconductor layer, a second conductive semiconductor layer on the active layer, a third semiconductor layer between the active layer and the second conductive semiconductor layer, and a light extraction structure on the second conductive semiconductor layer. A top surface of the third semiconductor layer has a Ga-face.

19 Claims, 14 Drawing Sheets

LIGHT EMITTING DEVICE AND LIGHT EMITTING DEVICE PACKAGE

The present application claims priority under 35 U.S.C. §119(a) of Korean Patent Application No. 10-2012-0043643 filed on Apr. 26, 2012, which is hereby incorporated by reference in its entirety.

BACKGROUND

The embodiment relates to a light emitting device.

The embodiment relates to a light emitting device package.

Studies and researches have been actively performed on a light emitting device and a light emitting device package including the light emitting device.

The light emitting device is a semiconductor light emitting diode including a semiconductor material to convert electrical energy into light.

When comparing with conventional light sources such as a fluorescent lamp and an incandescent lamp, the light emitting device has advantages in terms of low power consumption, a semi-permanent life span, a rapid response speed, safety, and an eco-friendly property. Accordingly, studies and researches to substitute the conventional light sources with semiconductor light emitting devices have been carried out.

In addition, the light emitting devices are increasingly used according to the trend as light sources of a variety of lamps used in indoor and outdoor places and lighting devices such as liquid crystal displays, electronic display boards, and streetlamps.

SUMMARY

The embodiment provides a light emitting device capable of improving the product yield and a light emitting device package.

According to the embodiment, there is provided a light emitting device including a first conductive semiconductor layer, an active layer on the first conductive semiconductor layer, a second conductive semiconductor layer on the active layer, a third semiconductor layer between the active layer and the second conductive semiconductor layer, and a light extraction structure on the second conductive semiconductor layer. A top surface of the third semiconductor layer has a Ga-face.

According to the embodiment, there is provided a light emitting device including a support substrate, an electrode layer on the support substrate, a first conductive semiconductor layer on the electrode layer, an active layer on the first conductive semiconductor layer, a third semiconductor layer on the active layer, a second conductive semiconductor layer contacting the third semiconductor layer, a light extraction structure on the second conductive semiconductor layer, and a protective layer at a peripheral region between the electrode layer and the first conductive semiconductor layer. A top surface of the third semiconductor layer has a Ga-face, and a top surface of the second conductive semiconductor layer has an N-face.

According to the embodiment, there is provided a light emitting device package including a body, a light emitting device on the body, and a molding member surrounding the light emitting device. The light emitting device includes a first conductive semiconductor layer, an active layer on the first conductive semiconductor layer, a second conductive semiconductor layer on the active layer, a third semiconductor layer between the active layer and the second conductive semiconductor layer, and a light extraction structure on the second conductive semiconductor layer. A top surface of the third semiconductor layer has a Ga-face.

DETAILED DESCRIPTION OF THE EMBODIMENTS

Figure 1:
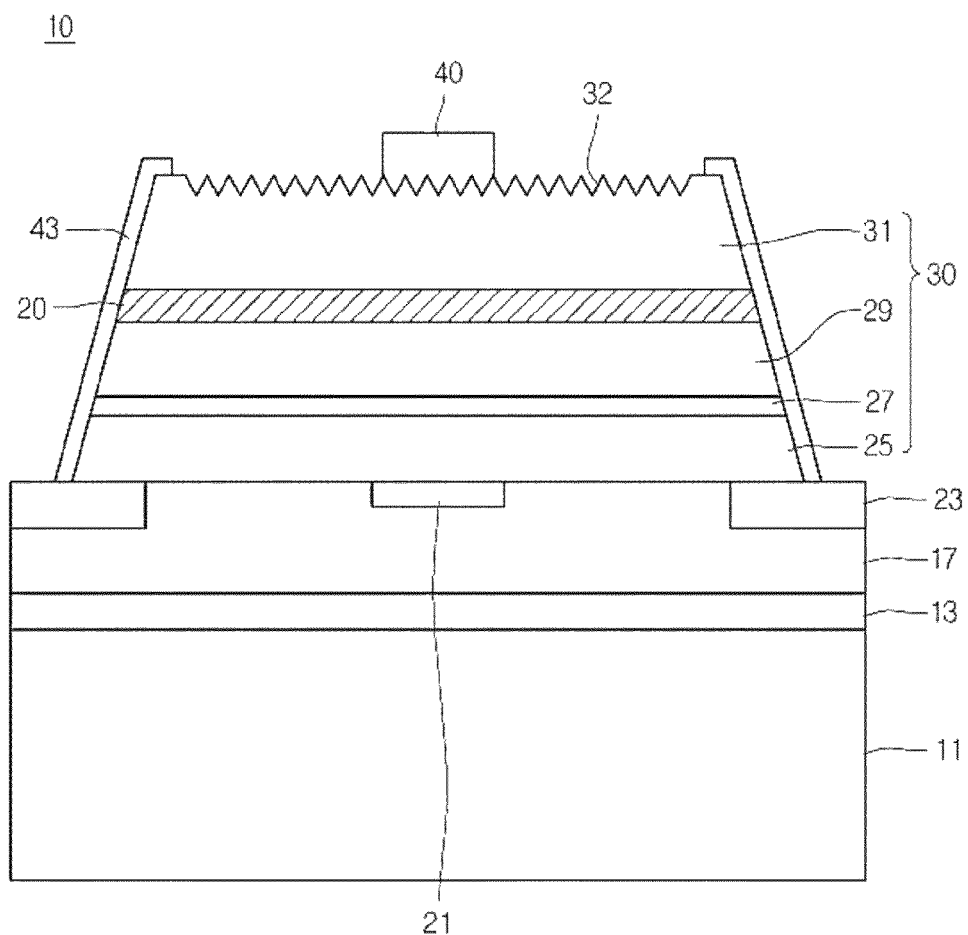
FIG. 1 is a sectional view showing a light emitting device according to the first embodiment.
Figure 2:
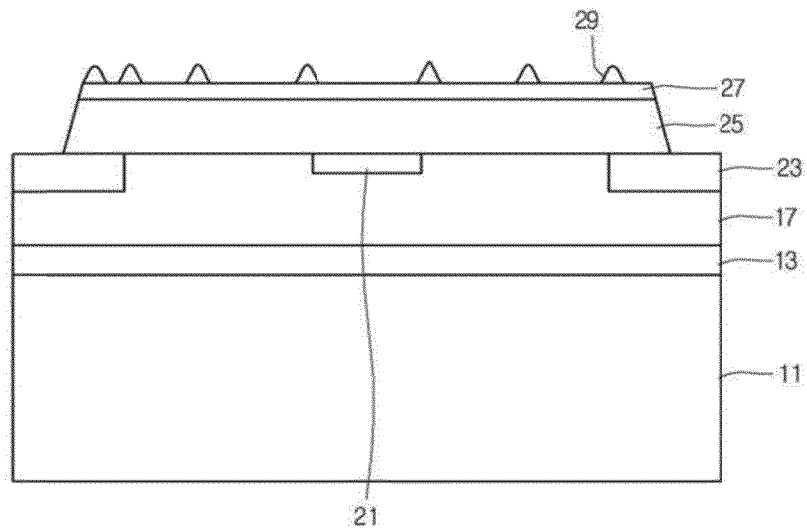
FIG. 2 is a view showing the state that an active layer is damaged due to over-etching when the third semiconductor layer of FIG. 1 is not provided.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

Hereinafter, the embodiment will be described with reference to accompanying drawings. In the drawings, the thickness or size of each layer is exaggerated, omitted, or schematically illustrated for convenience in description and clarity. In the drawings, the thickness or size of each component is exaggerated, omitted, or schematically illustrated for convenience in description and clarity.

FIG. 1 is a sectional view showing a light emitting device according to the first embodiment.

Referring to FIG. 1, a light emitting device 10 according to the first embodiment includes a support substrate 11, an electrode layer 17, a first protective layer 23, a light emitting structure 30, and an electrode 40.

The light emitting device 10 according to the first embodiment may further include an adhesive layer 13 interposed between the support substrate 11 and the electrode layer 17, but the embodiment is not limited thereto.

The light emitting device 10 according to the first embodiment may further include a current blocking layer 21 interposed between the electrode layer 17 and the light emitting structure 30, but the embodiment is not limited thereto.

The light emitting device 10 according to the first embodiment may further include a second protective layer 43 surrounding the light emitting structure 30, but the embodiment is not limited thereto.

The support substrate 11 may not only support a plurality of layers formed thereon, but serve as an electrode together with the adhesive layer 13 and the electrode layer 17. The support substrate 11 may supply power to the light emitting structure 30 together with the electrode 40.

The support substrate 11 may include a metallic material or a semiconductor material. The support substrate 11 may include a material representing electrical conductivity and thermal conductivity.

For instance, the metallic material may include at least one selected from the group consisting of titanium (Ti), chrome (Cr), nickel (Ni), aluminum (Al), platinum (Pt), gold (Au), tungsten (W), copper (Cu), the copper alloy (Cu Alloy), molybdenum (Mo) and copper-tungsten (Cu—W), but the embodiment is not limited thereto. For instance, the semiconductor material may include at least one selected from the group consisting of silicon (Si), germanium (Ge), gallium arsenide (GaAs), gallium nitride (GaN), zinc oxide (ZnO), silicon germanium (SiGe) and silicon carbide (SiC), but the embodiment is not limited thereto.

The support substrate 11 may be plated and/or deposited under the light emitting structure 30, or may be attached in the form of a sheet under the light emitting structure 30, but the embodiment is not limited thereto.

The support substrate 11 may be formed thereon with the adhesive layer 13. The adhesive layer 13 is interposed between the electrode layer 17 and the support substrate 11 while serving as a bonding layer. The adhesive layer 13 may serve as a medium to enhance the adhesive strength between the electrode layer 17 and the support substrate 11.

The adhesive layer 13 may include barrier metal or bonding metal. The adhesive layer 13 may include a metallic material representing a higher adhesive property and higher thermal conductivity. The adhesive layer 13 may include at least one selected from the group consisting of Ti, Au, Sn, Ni, Nb, Cr, Ga, In, Bi, Cu, Ag and Ta.

The adhesive layer 13 may be formed thereon with a barrier layer that is not shown. The barrier layer may prevent materials constituting the adhesive layer 13 and the support substrate 11 formed under the barrier layer from being spread to the electrode layer 17 or the light emitting structure 30 formed on the barrier layer to degrade the characteristic of the light emitting device 10.

The barrier layer may contact the bottom surface of the electrode layer 17.

When the electrode layer 17 and the first protective layer 23 are formed at the same layer, and the bottom surface of the electrode layer 17 is provided in a line with the bottom surface of the first protective layer 23, the barrier layer may contact the bottom surfaces of the electrode layer 17 and the first protective layer 23.

If the barrier layer is not formed, the adhesive layer 13 may contact the bottom surfaces of the first protective layer 23 and the electrode layer 17.

The barrier layer may include a single layer including a material selected from the group consisting of Ni, Pt, Ti, W, V, Fe and Mo or a stack layer of at least two materials described above.

The electrode layer 17 may be formed on the adhesive layer 13 or the barrier layer.

The electrode layer 17 reflects light incident thereto from the light emitting structure 30 to improve light extraction efficiency.

The electrode layer 17 may make ohmic contact with the light emitting structure 30, so that current may flow through the light emitting structure 30.

The electrode layer 17 may include a reflective layer contacting the top surface of the adhesive layer 13 and an ohmic contact layer interposed between the top surface of the reflective layer and the bottom surface of the light emitting structure 30.

The electrode layer 17 may include a single layer including the mixture of the reflective material and the ohmic contact material.

For instance, the reflective material may include at least one selected from the group consisting of Ag, Ni, Al, Rh, Pd, Ir, Ru, Mg, Zn, Pt, Au and Hf or the alloys of at least two materials described above, but the embodiment is not limited thereto. The ohmic contact material may include a conductive material or a metallic material. In other words, the ohmic contact material may include at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au and Ni/IrOx/Au/ITO.

For instance, the electrode layer 17 may include multiple layers including one of IZO/Ni, AZO/Ag, IZO/Ag/Ni and AZO/Ag/Ni.

The electrode layer 17 may make ohmic contact with at least the light emitting structure 30. Accordingly, current may be smoothly supplied to the light emitting structure 30 making ohmic contact with the electrode layer 17, so that the light emission efficiency can be improved.

The electrode layer 17 may overlap with the bottom surfaces of the light emitting structure 30, a current blocking layer 21, and the first protective layer 23. In order to totally reflect the light transmitted from the light emitting structure 30, the electrode layer 17 may have an area greater than that of the light emitting structure 30, especially, an active layer 27.

The support substrate 11, the adhesive layer 13, and the electrode layer 17 may serve as an electrode. Power is supplied to the light emitting structure 30 through the electrode including the support substrate 11, the adhesive layer 13, and the electrode layer 17, and an electrode 40, so that light may be generated from the light emitting structure 30.

The electrode layer 17 may be formed thereon with the current blocking layer 21. The current blocking layer 21 may contact the bottom surface of the light emitting structure 30. The current blocking layer 21 may overlap with at least a portion of the electrode 40 in a vertical direction.

The current blocking layer 21 may make schottky contact with the light emitting structure 30. Accordingly, current is not smoothly supplied to the light emitting structure 30 making schottky contact with the current blocking layer 21.

The current blocking layer 21 may include a plurality of patterns or a plurality of protrusions spaced apart from each other, but the embodiment is not limited thereto.

Current concentratedly flows along the shortest path between the support substrate 11 and the electrode 40. In order to prevent the current from concentratedly flowing, the current blocking layer 21 may be formed by allowing the electrode 40 to spatially overlap with a portion of the support substrate 11. Current may not fully flow through the current blocking layer 21 or may more slightly flow through the current blocking layer 21. On the contrary, since current smoothly flows through the electrode layer 17 contacting the first conductive semiconductor layer 25, the current uniformly flows throughout the whole region of the light emitting structure 30, so that the light emission efficiency can be improved.

The current blocking layer 21 may include a material representing electrical conductivity less than that of the electrode layer 17, representing an electrical insulating property less than that of the electrode layer 17, and making schottky contact with the light emitting structure 30. For instance, the current blocking layer 21 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al and Cr. In this case, the $SiO_2$, $SiO_x$, $SiO_xN_y$, $Si_3N_4$, and $Al_2O_3$ may be insulating materials.

Meanwhile, the current blocking layer 21 may be interposed between the electrode layer 17 and the light emitting structure 30, but the embodiment is not limited thereto.

The current blocking layer 21 may be formed in a groove formed in the electrode layer 17, may protrude from a top surface of the electrode layer 17, or may be formed in a hole formed through the top and bottom surfaces of the electrode layer 17, but the embodiment is not limited thereto.

The electrode layer 17 may be formed thereon with the first protective layer 23. For instance, the first protective layer 23 may be formed along an edge region of the electrode layer 17. In other words, the first protective layer 23 may be formed at a peripheral region interposed between the light emitting structure 30 and the electrode layer 17. In detail, a portion of the first protective layer 23 may be interposed between the electrode layer 17 and the light emitting structure 30 while vertically overlapping with both of the electrode layer 17 and the light emitting structure 30. For instance, a portion of the top surface of the first protective layer 23 may contact the first conductive semiconductor layer 25, and the inner side surface and the bottom surface of the first protective layer 23 may contact the electrode layer 17, but the embodiment is not limited thereto.

The first protective layer 23 may prevent the side surface of the electrode layer 17 from being electrically shorted with respect to the side surface of the light emitting structure 30 due to external foreign matters.

The contact area between the first protective layer 23 and the light emitting structure 30 is ensured, so that the first protective layer 23 can effectively prevent the light emitting structure 30 from being laminated from the electrode layer 17 upon a laser scribing process to divide a plurality of chips into individual chips and a laser lift off (LLO) process to remove a substrate.

When the light emitting structure 30 is over-etched in a chip division process, the electrode layer may be exposed. In this case, electrical short may occur at the side surfaces of the electrode layer and the active layer of the light emitting structure due to the foreign matters.

The first protective layer 23 according to the first embodiment may prevent the electrode layer 17 from being exposed due to the over-etching of the light emitting structure 30 in the chip division process.

The first protective layer 23 may include an insulating material. For instance, the first protective layer may include at least one selected from the group consisting of $SiO_2$, $SiO_x$, $SiO_xN_y$, $Si_3N_4$, and $Al_2O_3$. In addition, the first protective layer 23 may include a metallic material, but the embodiment is not limited thereto.

The first protective layer 23 may include a material the same as a material constituting the current blocking layer 21, or different from that of the current blocking layer 21, but the embodiment is not limited thereto. For instance, the first protective layer 23 and the current blocking layer 21 may include an insulating material.

When the first protective layer 23 may include a material the same as a material constituting the current blocking layer 21, the first protective layer 23 and the current blocking layer 21 may be simultaneously formed through the same process. In this case, the first protective layer 23 and the current blocking layer 21 may have the same thickness, but the embodiment is not limited thereto.

When the first protective layer 23 includes a material different from that of the current blocking layer 21, the first protective layer 23 may be formed separately from the current blocking layer 21 through processes different from each other. In this case, the first protective layer 23 may have the thickness different from that of the current blocking layer 21. For instance, the current blocking layer 21 may include an insulating material, and the first protective layer 23 may include a metallic material, but the embodiment is not limited thereto. The current blocking layer 21 may have the thickness smaller than that of the first protective layer 23, but the embodiment is not limited thereto.

The light emitting structure 30 may be formed on the electrode layer 17, the first protective layer 23, and the current blocking layer 21.

The side surface of the light emitting structure 30 may be perpendicularly formed or inclined through the etching scheme to divide a plurality of chips into individual chips. For instance, the side surface of the light emitting structure 30 may be formed through an isolation etching scheme.

The light emitting structure 30 may include a group II-VI compound semiconductor material or a group III-V compound semiconductor material.

The light emitting structure 30 may include the first conductive semiconductor layer 25, the active layer 27, a third semiconductor layer 20, and a second conductive semiconductor layer 31, but the embodiment is not limited thereto.

Although description is made in that the third semiconductor layer 20 is included in the light emitting structure 30 according to the first embodiment, the embodiment is not limited thereto. For instance, the third semiconductor layer 20 may not be included in the light emitting structure 30.

The light emitting structure 30 may further include a fourth conductive semiconductor layer 29 interposed between the active layer 27 and the third semiconductor layer 20, but the embodiment is not limited thereto.

The fourth conductive semiconductor layer 29 may be interposed between the active layer 27 and the third semiconductor layer 20, or may not be formed.

The first conductive semiconductor layer 25 may be formed on the electrode layer 17, the first protective layer 23, and the current blocking layer 21. The first conductive semiconductor layer 25 may include a P type semiconductor layer including P type dopants. The first conductive semiconductor layer 25 may include a group II-VI compound semiconductor or a group III-V compound semiconductor. For instance, the first conductive semiconductor layer 25 may include one selected from the group consisting of GaN, MN, AlGaN, InGaN, InN, InAlGaN, AlInN, AlGaAs, GaP, GaAs, GaAsP and AlGaInP. The P type dopants may include Mg, Zn, Ga, Sr, and Ba. The first conductive semiconductor layer 25 may be formed in a single layer or multiple layers, but the embodiment is not limited thereto.

The first conductive semiconductor layer 25 supplies a plurality of carriers (e.g., holes) to the active layer 27.

The active layer 27 is formed on the first conductive semiconductor layer 25, and may have one of a single quantum well structure, a multi quantum well (MQW) structure, a quantum dot structure, and a quantum wire structure, but the embodiment is not limited thereto.

The active layer 27 may be formed at the periodicity of a well layer and a barrier layer using a group II-VI compound semiconductor material or a group III-V compound semiconductor material. The compound semiconductor material constituting the active layer 27 may include GaN, InGaN, or AlGaN. Accordingly, for instance, the active layer 27 may have the periodicity of InGaN/GaN, InGaN/AlGaN, or InGaN/InGaN, but the embodiment is not limited thereto.

The active layer 27 may generate light having a wavelength corresponding to the energy bandgap determined by the semiconductor material of the active layer 27 through the recombination of holes, which are supplied from the first conductive semiconductor layer 25, and electrons supplied from the second conductive semiconductor layer 31 and the fourth conductive semiconductor layer 29.

Although not shown, a conductive clad layer may be formed on and/or under the active layer 27, and may include an AlGaN-based semiconductor material. For instance, a P type clad layer including P type dopants may be interposed between the first conductive semiconductor layer 25 and the active layer 27, and an N type clad layer including N type dopants may be interposed between the active layer 27 and the fourth conductive semiconductor layer 29.

The conductive clad layer serves as a guide to prevent the holes and electrons supplied to the active layer 27 from being moved to the first conductive semiconductor layer 25 and the fourth conductive semiconductor layer 29. Accordingly, the larger quantity of holes and electrons supplied to the active layer 27 are recombined with each other due to the conductive clad layer, so that the light emission efficiency of the light emitting device 10 can be improved.

The second conductive semiconductor layer 31 may be formed on the active layer 27. The second conductive semiconductor layer 31 may include an N type semiconductor layer including N type dopants. The second conductive semiconductor layer 31 may include a group II-V compound semiconductor or a group III-V compound semiconductor. For instance, the second conductive semiconductor layer 31 may include one selected from the group consisting of GaN, AlN, AlGaN, InGaN, InN, InAlGaN, AlInN, AlGaAs, GaP, GaAs, GaAsP and AlGaInP. The N type dopants may include Si, Ge, Sn, Se, and Te. The second conductive semiconductor layer 31 may be formed in a single layer or multiple layers, but the embodiment is not limited thereto.

When the light emitting structure 30 is grown, the light emitting structure 30 may be grown in the order of the second conductive semiconductor layer 31, the active layer 27, and the first conductive semiconductor layer 25.

The second conductive semiconductor layer 31 may be formed at the top surface thereof with a light extraction structure 32 for the purpose of improving light extraction efficiency. The light extraction structure 32 may be formed at a random pattern through a wet etching process, or may be formed at a periodic pattern like a photonic crystal structure formed through a pattern process, but the embodiment is not limited thereto.

The light extraction structure 32 may periodically have a concave shape and a convex shape. For instance, the concave shape and the convex shape may have a rounded surface or two inclined surfaces meeting at a vertex.

When both of the third semiconductor layer 20 and the fourth conductive semiconductor layer 29 are not formed, and when the wet etching process is performed in order to form the light extraction structure 32, the entire portion of the second conductive semiconductor layer 31 may be etched due to the over-etching, so that the active layer 27 may be exposed. In this case, the active layer 27 may be partially etched through the etching process, so that the intrinsic function of the light emitting device may not be formed, that is, the light cannot be generated, which refers to the failure of the light emitting device. Accordingly, the yield may be lowered due to the failure.

According to the light emitting device of the first embodiment, in order to prevent the active layer 27 from being damaged due to the over-etching, the third semiconductor layer 20 may be formed between the second conductive semiconductor layer 31 and the active layer 27. Regarding the growing process of the light emitting structure 30, after growing the second conductive semiconductor layer 31, the third semiconductor layer 20 and the fourth conductive semiconductor layer 29 may be sequentially formed on the second conductive semiconductor layer 31, and then the active layer 27 and the first conductive semiconductor layer 25 may be grown. As described above, the fourth conductive semiconductor layer 29 may be formed or may not be formed on the third semiconductor layer 20.

When the second conductive semiconductor layer 31 is etched in order to form the light extraction structure 32, even if the entire portion of the second conductive semiconductor layer 31 disposed on the third semiconductor layer 20 is etched due to the over-etching, the third semiconductor layer 20 prevents the active layer 27 from being etched. Accordingly, the entire portion of the active layer 27 disposed under the third semiconductor layer 20 is completely protected, so that the failure of the light emitting device can be prevented, thereby improving the yield.

The third semiconductor layer 20 may have a Ga-face at an surface to be etched, that is, the surface contacting the etchant, but the embodiment is not limited thereto. In other words, the top surface of the third semiconductor layer 20 contacting the bottom surface of the second conductive semiconductor layer 31 may have the Ga-face.

The third semiconductor layer 20 may include a group II-V compound semiconductor material or a group III-V compound semiconductor material identical to that of at least one of the second conductive semiconductor layer 31 and the fourth conductive semiconductor layer 29, but the embodiment is not limited thereto.

Figure 3:
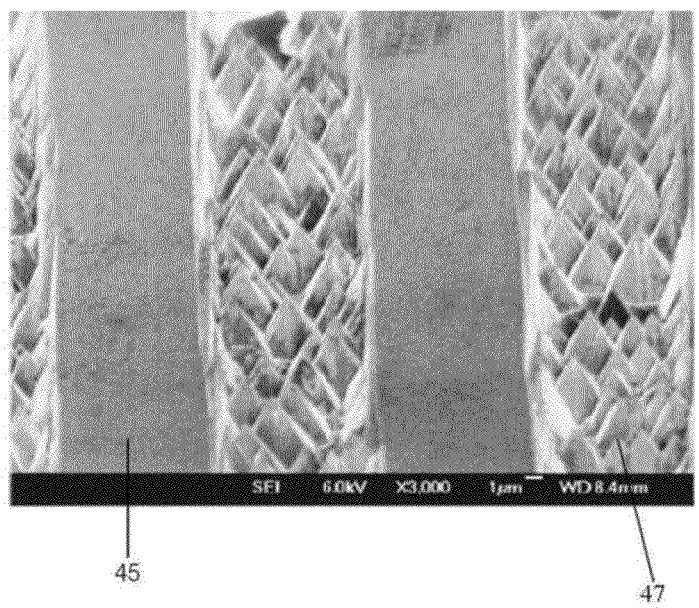
FIG. 3 is a view showing the etched state of a G-face and an N-face

It can be recognized from FIG. 3 that a semiconductor layer having an N-face 47 is more easily etched, but a semiconductor layer having a Ga-face 45 may be hardly etched.

A compound semiconductor layer may be formed by growing the mixture of gallium (Ga) and nitrogen (N) materials upward. In this case, indium (In) and aluminum (Al) materials may be added to the compound semiconductor layer.

The above compound semiconductor layer may be etched at the bottom surface or the top surface thereof.

In other words, the compound semiconductor layer may be etched upward from the bottom surface thereof. The bottom surface of the compound semiconductor layer may have an N-face.

In other words, the compound semiconductor layer may be etched downward from the top surface thereof. The top surface of the compound semiconductor layer may have a Ga-face.

The N-face has thermal stability and an operating voltage characteristic different from those of the Ga-face.

In general, the Ga-face has crystalline superior to that of the N-face, so that the Ga-face has thermal stability superior to that of the N-face.

In addition, the Ga-face has the operating voltage characteristic superior to that of the N-face.

When the light emitting device operates for a long time, for instance, 10 hours, the Ga-face is hardly changed in the operating voltage characteristic, but the N-face is degraded in the operating voltage characteristic.

Accordingly, if the electrical contact is made on the Ga-face, the light emitting device having the superior operating voltage characteristic can be obtained.

Figure 4:
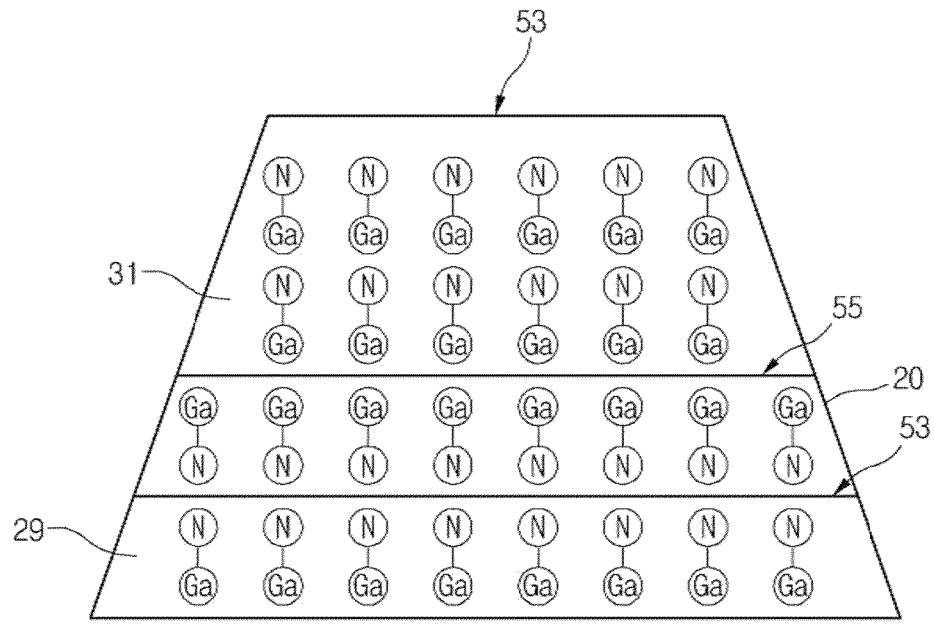
FIG. 4 is a view showing a Ga—N bonding structure through the growing of the third semiconductor layer and the second conductive semiconductor layer of FIG. 1.

According to the light emitting device of the first embodiment, based on different etching states, the N-face may be formed on the top surface of the second conductive semiconductor layer 31 that forms a concave-convex pattern of the light extraction structure 32, and the Ga-face may be formed on the top surface of the third semiconductor layer 20. Accordingly, the second conductive semiconductor layer 31 is easily etched, so that the light extraction structure 32 may be formed, and the active layer 27 under the third semiconductor layer 20 can be protected from being etched by the third semiconductor layer 20 even if the second conductive semiconductor layer 31 is over-etched. As shown in FIG. 4, both of the top surfaces of the second conductive semiconductor layer 31 and the fourth conductive semiconductor layer 29 have N-faces, but the top surface of the third semiconductor layer 20 may have the Ga-face.

When the top surface has the Ga-face, Ga may be distributed a position higher than that of N in the Ga—N covalent bonding structure.

On the contrary, when the top surface has the N-face, N may be distributed a position higher than that Ga in the Ga—N covalent bonding structure.

Therefore, the N in the Ga—N covalent bonding structure may be distributed at position higher than that of Ga in the top surface of the second conductive semiconductor layer 31, and the Ga in the Ga—N covalent bonding structure may be distributed at position higher than that of N in the top surface of the third semiconductor layer 20. In addition, the N may be distributed at position higher than that of N in the top surface of the fourth conductive semiconductor layer 29.

Accordingly, the Ga—N covalent bonding structure of the third semiconductor layer 20 is opposite to those of the second conductive semiconductor layer 31 and the fourth conductive semiconductor layer 29.

In the growing process, a delta doping scheme may be used to form Ga—N covalent bonding structures opposite to each other, but the embodiment is not limited thereto.

According to the delta doping scheme, in order to grow an upper semiconductor layer having a Ga—N covalent bonding structure opposite to that of a lower semiconductor layer, after growing the lower semiconductor layer, dopants such as Si and Mg are arbitrarily added, and then the upper semiconductor layer is grown from the lower semiconductor layer. In this case, the upper semiconductor layer may have the Ga—N covalent bonding structure opposite to that of the lower semiconductor layer.

The third semiconductor layer 20 may have the thickness of about 20 nm to about 1 μm.

If the thickness of the third semiconductor layer 20 is 20 nm or less, the third semiconductor layer 20 has an excessive thin thickness, so that the third semiconductor layer 20 is not uniformly formed, but sparsely formed like islands.

If the thickness of the third semiconductor layer 20 is 1 μm or more, the thickness of the light emitting device is increased.

The third semiconductor layer 20 may contact the active layer 27, or may be spaced apart from the active layer 27. If the third semiconductor layer 20 is spaced apart from the active layer 27, the fourth conductive semiconductor layer 29 may be interposed between the third semiconductor layer 20 and the active layer 27.

If the third semiconductor layer 20 contacts the active layer 27, the third semiconductor layer 20 may be doped with N type dopants similarly to or the same as the second conductive semiconductor layer 31 and have the top surface having a Ga-face. In this case, the third semiconductor layer 20 may prevent the active layer 27 from being damaged due to the over-etching while serving as a conductive layer to generate electrons to be supplied to the active layer 27.

According to another embodiment, the third semiconductor layer 20 may be spaced apart from the active layer 27 by the distance from about 500 nm to about 2 μm. In other words, the third semiconductor layer 20 may not contact the active layer 27. If the third semiconductor layer 20 is spaced apart from the active layer 27 by the distance of 2 μm or more, light loss may be increased. In other words, if the fourth conductive semiconductor layer 29 has the excessive thick thickness, the light loss may be increased.

If the third semiconductor layer 20 is spaced apart from the active layer 27 by the distance of at least 500 nm or less, that is, if the thickness of the fourth conductive semiconductor layer 29 is 500 nm or less, since the fourth conductive semiconductor layer 29 cannot produce the sufficient amount of electrons, the electrons may not be smoothly supplied to the active layer 27, so that the light efficiency may be degraded.

If the sufficient amount of electrons can be produced in the fourth conductive semiconductor layer 29, the third semiconductor layer 20 does not include dopants, or the concentration of N type dopants of the third semiconductor layer 20 may be less than that of the N type dopants of the fourth conductive semiconductor layer 29 or may have no dopants, but the embodiment is not limited thereto.

Accordingly, the fourth conductive semiconductor layer 29 between the active layer 27 and the third semiconductor layer 20 may have the thickness of about 500 nm to about 2 μm, but the embodiment is not limited thereto.

If the third semiconductor layer 20 sufficiently serves as the fourth conductive semiconductor layer 29, that is, if electrons are sufficiently produced, the fourth conductive semiconductor layer 29 is not required between the third semiconductor layer 20 and the active layer 27. In this case, the third semiconductor layer 20 may directly contact the active layer 27.

The electrode 40 may be formed on the light emitting structure 30. The electrode 40 does not cover the whole area of the light emitting structure 30, but may be locally formed at a predetermined pattern shape.

Although not shown, the electrode 40 may include at least one electrode pad, to which a wire is bonded, and a plurality of electrode lines branching to at least one side from the electrode pad to uniformly supply current throughout the whole region of the light emitting structure.

The electrode lines may include a material the same as a material constituting the electrode pad or a material different from that of the electrode pad.

When viewed from the top, the electrode pad may have the shape of a rectangle, a circle, an oval, or a polygon, but the embodiment is not limited thereto.

The electrode 40 may include a metallic material representing superior electrical conductivity, but the embodiment is not limited thereto. The electrode 40 may include a metallic material representing superior reflection efficiency of light, but the embodiment is not limited thereto. The electrode 40 may include a metallic material representing both of superior electrical conductivity and superior reflection efficiency of the light, but the embodiment is not limited thereto.

For instance, the electrode may include a single layer or multiple layers including at least one selected from the group consisting of V, W, Au, Ti, Ni, Pd, Ru, Cu, Al, Cr, Ag and Pt.

Meanwhile, the electrode lines may include a material representing light transmittance and electrical conductivity. For instance, the electrode lines may include at least one of ITO, IZO, IZTO, IAZO, IGZO, IGTO, AZO, ATO, and ZnO.

The light emitting structure 30 may be formed thereon with the second protective layer 43. For instance, the second protective layer 43 may be formed on at least a side surface of the light emitting structure 30. In detail, one end of the second protective layer 43 may be formed at a peripheral region of a top surface of the second conductive semiconductor layer 31, and an opposite end of the second protective layer 43 may be formed on a portion of the top surface of the first protective layer 23 through the side surface of the second conductive semiconductor layer 31, the side surface of the active layer 27, and the side surface of the first conductive semiconductor layer 25, but the embodiment is not limited thereto.

The second protective layer 43 may prevent electrical short between the light emitting structure 30 and the support substrate 11. The second protective layer 43 may include a material representing superior transmittance and a superior insulating property. For instance, the second protective layer 43 may include one selected from the group consisting of $SiO_2$, $SiO_x$, $SiO_xN_y$, $Si_3N_4$, $TiO_2$ and $Al_2O_3$, but the embodiment is not limited thereto.

The second protective layer 43 may include a material the same as materials constituting the first protective layer 23 and/or the current blocking layer 21, but the embodiment is not limited thereto.

FIGS. 5 to 9 are sectional views showing the manufacturing process of the light emitting device according to the first embodiment.

Figure 5:
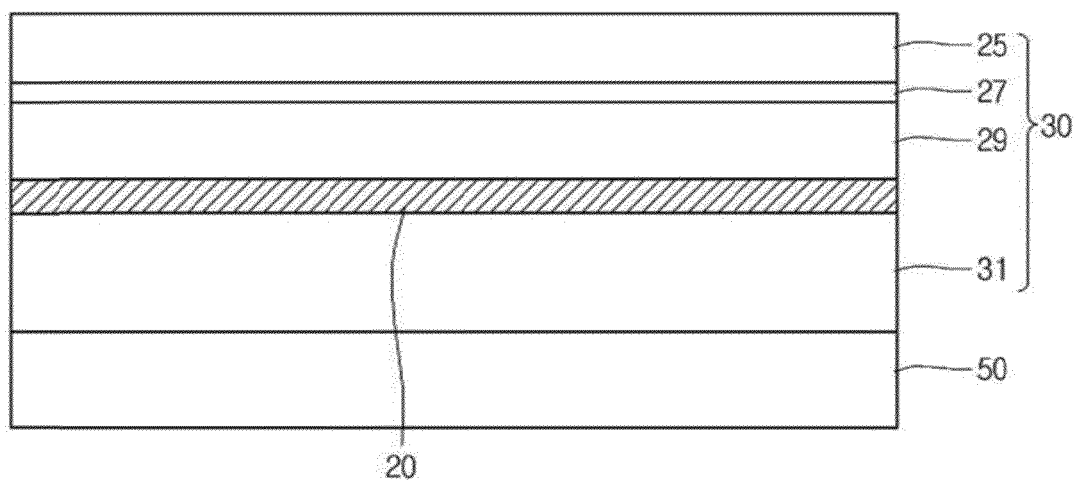
FIGS. 5 to 9 are sectional views showing the manufacturing process of the light emitting device according to the first embodiment.

Referring to FIG. 5, the second conductive semiconductor layer 31, the third semiconductor layer 20, the fourth conductive semiconductor layer 29, the active layer 27, and the first conductive semiconductor layer 25 may be sequentially grown from a growth substrate 50, thereby forming the light emitting structure 30. The second conductive semiconductor layer 31 and the fourth conductive semiconductor layer 29 may include the same compound semiconductor, but the embodiment is not limited thereto.

The second conductive semiconductor layer 31 may be grown on the growth substrate 50, the third semiconductor layer 20 may be grown on the second conductive semiconductor layer 31, the fourth conductive semiconductor layer 29 may be grown on the third semiconductor layer 20, the active layer 27 is grown on the fourth conductive semiconductor layer 29, and the first conductive semiconductor layer 25 may be grown on the active layer 27. If the third semiconductor layer 20 produces the sufficient amount of carriers such as electrons or holes like the second conductive semiconductor layer 31, the fourth conductive semiconductor layer 29 may be omitted, but the embodiment is not limited thereto.

The first conductive semiconductor layer 25 may include P type dopants, and the second and fourth conductive semiconductor layers 31 and 29 may include N type dopants, but the embodiment is not limited thereto.

The third semiconductor layer 20 may include N type dopants or the concentration of the N type dopants of the third semiconductor layer 20 may be less than the concentration of the N type dopants of the second conductive semiconductor layer 31 or the fourth conductive semiconductor layer 29, but the embodiment is not limited thereto.

The bottom surfaces of the second and fourth conductive semiconductor layers 31 and 29 may have an N-face, and the bottom surface of the third semiconductor layer 20 may have a Ga-face.

The delta doping process may be performed when the third semiconductor layer 20 is formed on the second conductive semiconductor layer 31, and when the fourth conductive semiconductor layer 29 is formed on the third semiconductor layer 20. Through the delta doping process, Ga—N covalent bonding structures opposite to each other are formed between the second conductive semiconductor layer 31 and the third semiconductor layer 20, or between the third semiconductor layer 20 and the fourth conductive semiconductor layer 29, but the embodiment is not limited thereto.

The growth substrate 50 is used to grow the light emitting structure 30. The growth substrate 50 may include a material suitable for the growth of a semiconductor material, that is, a carrier wafer. In addition, the growth substrate 50 may include a material having a lattice constant similar to that of the light emitting structure 30 and thermal stability, and may include a conductive substrate or an insulating substrate.

For instance, the growth substrate 50 may include at least one selected from the group consisting of sapphire ($Al_2O_3$), SiC, GaAs, GaN, ZnO, Si, GaP, InP, and Ge, but the embodiment is not limited thereto.

For instance, the light emitting structure 30 may be formed through a metal organic chemical vapor deposition (MOCVD) scheme, a chemical deposition vapor (CVD) scheme, a plasma-enhanced chemical vapor deposition (PECVD) scheme, a molecular beam epitaxy (MBE) scheme, or a hydride vapor phase epitaxy (HVPE) scheme, but the embodiment is not limited thereto.

A buffer layer (not shown) may be formed between the light emitting structure 30 and the growth substrate 50 in order to reduce the lattice constant difference therebetween.

The second conductive semiconductor layer 31 and the fourth conductive semiconductor layer 29 may be formed on the growth substrate 50. The second conductive semiconductor layer 31 and the fourth conductive semiconductor layer 29 may be N type semiconductor layers including N type dopants.

The third semiconductor layer 20 may be formed on the second conductive semiconductor layer 31 and the fourth conductive semiconductor layer 29.

The third semiconductor layer 20 may include a group II-VI compound semiconductor material or a group III-V compound semiconductor material the same as those of the second conductive semiconductor layer 31 and the fourth conductive semiconductor layer 29, but the embodiment is not limited thereto. The third semiconductor layer 20 may include dopants or may not include dopants. In addition, the concentration of N type dopants of the third semiconductor layer 20 may be less than that of the second conductive semiconductor layer 31 or the fourth conductive semiconductor layer 29.

The third semiconductor layer 20 may have the thickness of about 20 nm to about 1 μm, but the embodiment is not limited thereto.

The fourth conductive semiconductor layer 29 interposed between the third semiconductor layer 20 and the active layer 27 may have the thickness of 0 μm to 2 μm, but the embodiment is not limited thereto.

The third semiconductor layer 20 may contact the active layer 27, or may be spaced apart from the active layer 27 while interposing the fourth conductive semiconductor layer 29 therebetween.

The active layer 27 is formed on the fourth conductive semiconductor layer 29, and may have one of a single quantum well structure, a multi quantum well (MQW) structure, a quantum dot structure, and a quantum wire structure, but the embodiment is not limited thereto.

The active layer 27 may generate light having a wavelength corresponding to the energy bandgap determined by the semiconductor material of the active layer 27 through the recombination of holes, which are supplied from the first conductive semiconductor layer 25, and electrons supplied from the fourth conductive semiconductor layer 29.

The first conductive semiconductor layer 25 may be formed on the active layer 27. The first conductive semiconductor layer 25 may be a P type semiconductor layer including P type dopants.

Figure 6:
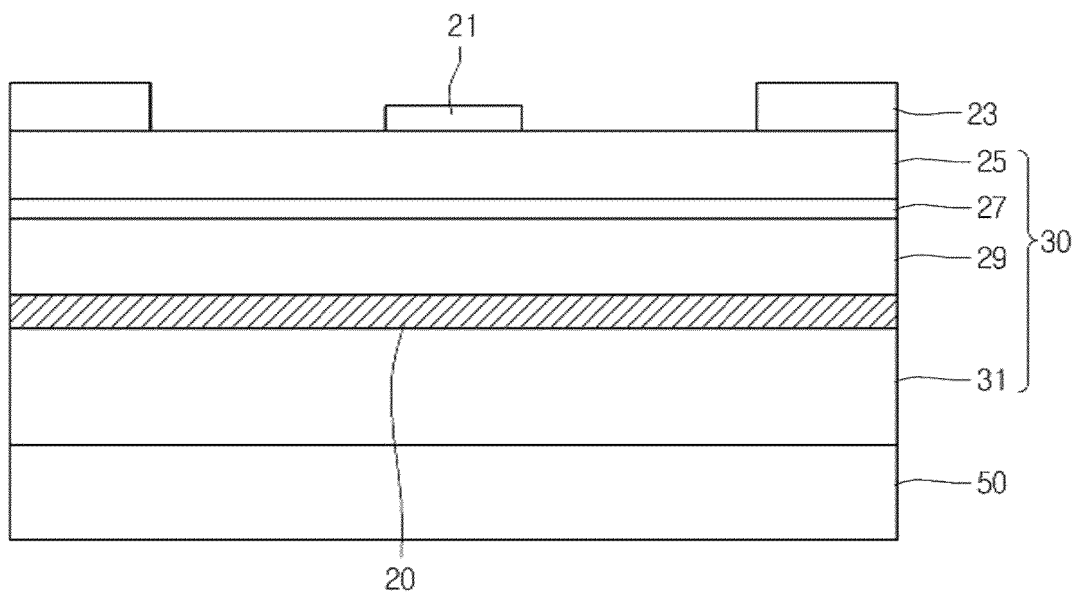

Referring to FIG. 6, the first conductive semiconductor layer 25 may be formed thereon with the current blocking layer 21 and the first protective layer 23.

At least a portion of the current blocking layer 21 may spatially overlap with the electrode 40 to be formed in the subsequent processor.

The current blocking layer 21 may block current supplied to the first conductive semiconductor layer 25 through the electrode layer 17 or may reduce the quantity of the current.

Accordingly, current may not fully flow through the current blocking layer 21 or may more slightly flow through the current blocking layer 21. On the contrary, since current smoothly flows through the electrode layer 17 contacting the first conductive semiconductor layer 25, the current uniformly flows throughout the whole region of the light emitting structure 30, so that the light emission efficiency can be improved.

If a plurality of electrodes 40 are provided, a plurality of current blocking layers 21 may be provided corresponding to the electrodes 40, respectively.

The first protective layer 23 may be formed on the first conductive semiconductor layer 25. For instance, the first protective layer 23 may be formed at a peripheral region of the first conductive semiconductor layer 25, but the embodiment is not limited thereto.

Figure 7:
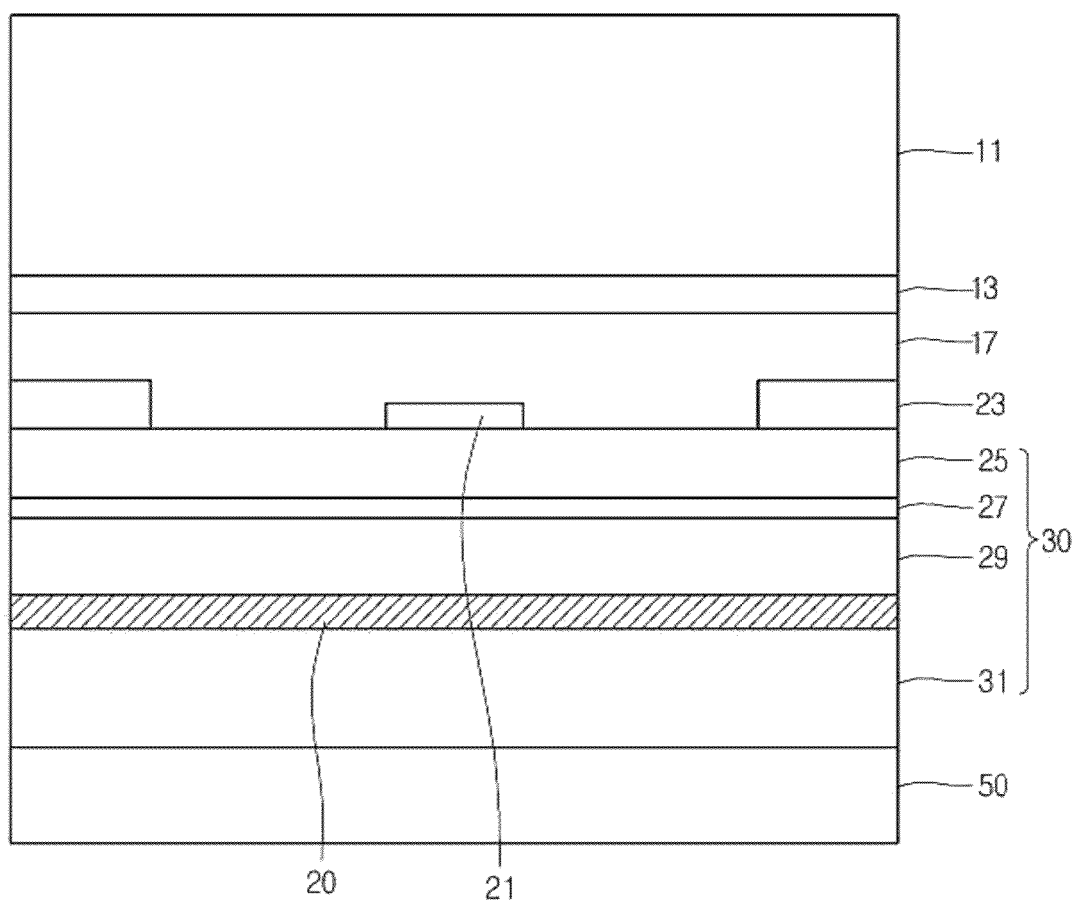

Referring to FIG. 7, the electrode layer 17, the adhesive layer 13, and the support substrate 11 may be formed on the current blocking layer 21, the first protective layer 23, and the first conductive semiconductor layer 25.

The electrode layer 17 may include an ohmic contact layer and a reflective layer sequentially stacked on the first conductive semiconductor layer 25.

The electrode layer 17 may include a single layer including the mixture of the reflective material and the ohmic contact material on the first conductive semiconductor layer 25.

The adhesive layer 13 may be interposed between the support substrate 11 and the electrode layer 17 to enhance the adhesive strength therebetween.

The support substrate 11 may not only support a plurality of layers formed thereon, but serve as an electrode. The support substrate 11 may supply power to the light emitting structure 30 together with the electrode 40.

For instance, the support substrate 11 may include at least one of Ti, Cr, Ni, Al, Pt, Au, W, Cu, Mo, and Cu—W.

The support substrate 11 may be formed on the light emitting structure 30 through a plating process or a deposition process, or may be attached in the form of a sheet onto the light emitting structure 30, but the embodiment is not limited thereto.

Figure 8:
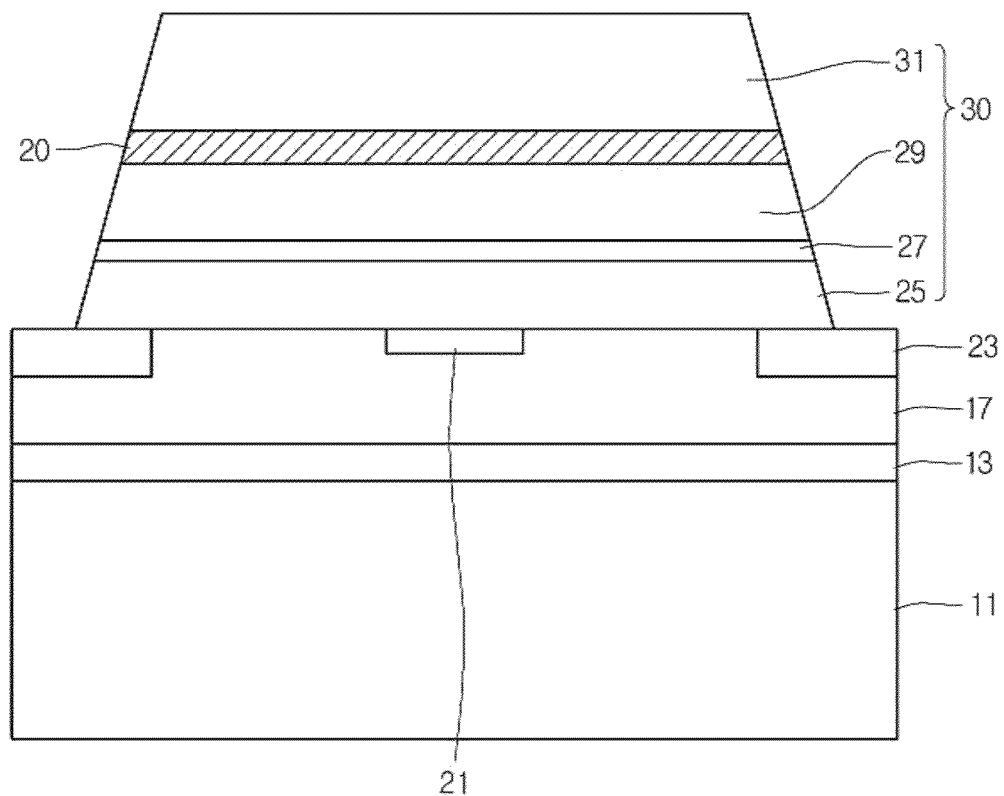

Referring to FIG. 8, after turning the growth substrate 50 at 180°, the growth substrate 50 may be removed.

The growth substrate 50 may be removed through a laser lift off (LLO) scheme, a chemical lift off (CLO) scheme, or a physical polishing scheme, but the embodiment is not limited thereto.

When the growth substrate 50 is removed through the LLO scheme, a laser beam is concentratedly irradiated onto the interfacial surface between the growth substrate 50 and the second conductive semiconductor layer 31 so that the growth substrate 50 may be separated from the second conductive semiconductor layer 31.

When the growth substrate 50 is removed through the CLO scheme, the growth substrate 50 is removed through a wet etching scheme, so that the second conductive semiconductor layer 31 may be exposed.

When the growth substrate 50 is removed through the physical polishing scheme, the growth substrate 50 may be removed sequentially from the top surface thereof by directly polishing the growth substrate 50, so that the second conductive semiconductor layer 31 may be exposed.

Thereafter, a mesa etching process may be performed so that the side surface of the light emitting structure 30, the side surface of the third semiconductor layer 20, and the side surface of the first protective layer are exposed in the inclined shape. The first conductive semiconductor layer 25, the active layer 27, and the second conductive semiconductor layer 31 formed at the outer region of a groove may be removed through the mesa etching process.

Since the first protective layer 23 serves as a stopper, even though portions of the first conductive semiconductor layer 25, the active layer 27, and the second and fourth conductive semiconductor layers 29 and 31 are removed from the outer region of the groove through the mesa etching process, the electrode layer 17, the adhesive layer 13, and the support substrate 11 formed under the first protective layer 23 are not removed.

Figure 9:
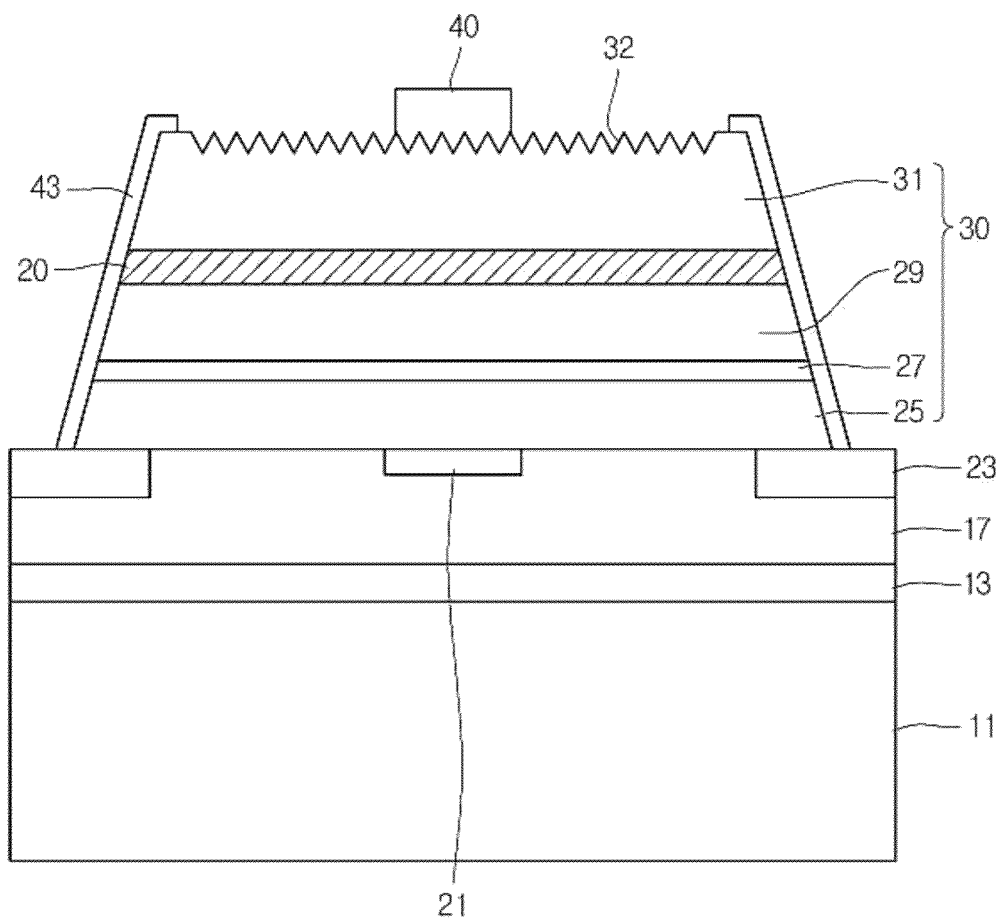

Referring to FIG. 9, the second protective layer 43 may be formed on at least the light emitting structure 30.

In other words, the second protective layer 43 may be formed from the peripheral region of the top surface of the second conductive semiconductor layer 31 to a portion of the top surface of the first protective layer 23 through the side surface of the fourth conductive semiconductor layer 29, the side surface of the active layer 27, and the side surface of the first conductive semiconductor layer 25.

The second protective layer 43 may prevent electrical short between the light emitting structure 30 and the support substrate 11. The second protective layer 43 may include a material representing superior transmittance and a superior insulating property. The second protective layer 43 may include a material the same as those of the first protective layer 23 and the current blocking layer 21.

The light extraction structure 32 may be formed at the top surface of the second conductive semiconductor layer 31 exposed by the second protective layer 43 by performing the etching process using the second protective layer 43 as a mask.

The light extraction structure 32 may improve the light extraction efficiency by scattering the light passing through the top surface of the second conductive semiconductor layer 31.

When the etching process is performed in order to form the light extraction structure 32, most portions of the second conductive semiconductor layer 31 may be removed due to the over-etching.

According to the first embodiment, the third semiconductor layer 20 may be formed between the second conductive semiconductor layer 31 and the active layer 27. In this case, even if the entire portion of the second conductive semiconductor layer 31 on the third semiconductor layer 20 is removed, since the active layer 27 is prevented from being etched by the third semiconductor layer 20, the failure of the light emitting device can be prevented, so that the yield can be improved.

The electrode 40 including a plurality of electrode pads and a plurality of electrode lines may be formed on the second conductive semiconductor layer 31 including the light extraction structure 32.

Figure 10:
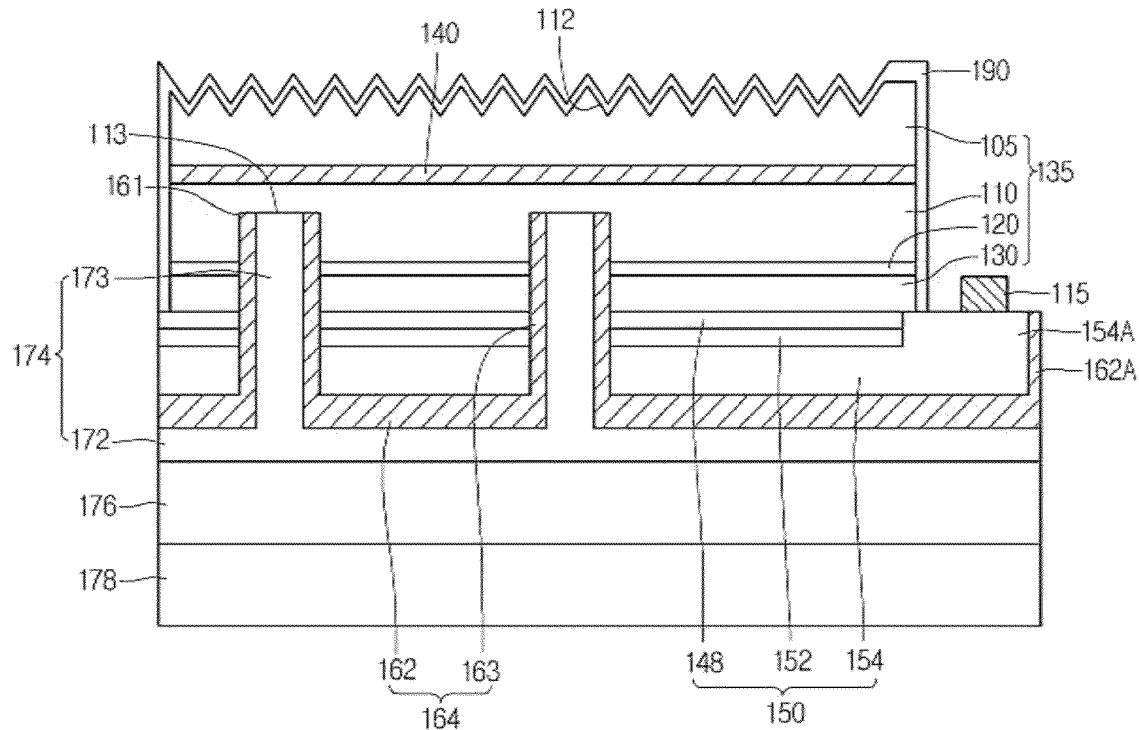
FIG. 10 is a sectional view showing a light emitting device according to the second embodiment.

FIG. 10 is a sectional view showing a light emitting device according to a second embodiment.

Referring to FIG. 10, a light emitting device 100 according to the second embodiment includes a light emitting structure 135, a first electrode layer 150, a first insulating layer 164, a second electrode layer 174, a support substrate 178, and an electrode 115.

The light emitting device 100 according to the second embodiment may further include an adhesive layer 176 interposed between the support substrate 178 and the second electrode layer 174, but the embodiment is not limited thereto.

The light emitting device 100 according to the second embodiment may further include a second insulating layer 190 surrounding the light emitting structure 135, but the embodiment is not limited thereto.

The second insulating layer 190 may include a material the same as that of the second protective layer 43 of the first embodiment, so that the second insulating layer 190 may substantially have the same function as that of the second protective layer 43, that is, a protective function, but the embodiment is not limited thereto.

The light emitting device 100 may include a plurality of compound semiconductor layers including a group II-VI compound semiconductor material or a group III-V compound semiconductor material. The light emitting device 100 may generate light, such as blue light, green light, or red light, having a visible wavelength band, or ultraviolet light. The light generated from the light emitting device may be realized by using various semiconductor materials within the technical scope of the embodiment, but the embodiment is not limited thereto.

The light emitting structure 135 may include a first conductive semiconductor layer 130, an active layer 120, a third semiconductor layer 140, and a second conductive semiconductor layer 105. The third semiconductor layer 140 may not be included in the light emitting structure 135, but the embodiment is not limited thereto.

The first conductive semiconductor layer 130 may be disposed under the active layer 120, and the second conductive semiconductor layer 105 may be disposed on the active layer 120. The thickness of the second conductive semiconductor layer 105 may be at least thicker than that of the first conductive semiconductor layer 130, but the embodiment is not limited thereto.

The light emitting structure 135 may further include a fourth conductive semiconductor layer 110 interposed between the active layer 120 and the third semiconductor layer 140, but the embodiment is not limited thereto.

For instance, the first conductive semiconductor layer 130 may have a conductive type opposite to that of the second conductive semiconductor layer 105. For instance, the first conductive semiconductor layer 130 may have a P type, and the second conductive semiconductor layer 105 may have an N type, but the embodiment is not limited thereto.

The first conductive semiconductor layer 130 may include a group II-VI compound semiconductor, or a group III-V compound semiconductor including first conductive dopants. For instance, the first conductive semiconductor layer 130 may include GaN, AlN, AlGaN, InGaN, InN, InAlGaN, AlInN, AlGaAs, GaP, GaAs, GaAsP, or AlGaInP. The first conductive semiconductor layer 130 may include a semiconductor layer having the compositional formula of $In_xAl_yGa_{1-x-y}N$ ($0 \leq x \leq 1$, $0 \leq y \leq 1$, and $0 \leq x+y \leq 1$).

The first conductive semiconductor layer 130 may include a P type semiconductor layer, and the first conductive dopants include P type dopants such as Mg and Zn. The first conductive semiconductor layer 130 may include a single layer or multiple layers, but the embodiment is not limited thereto.

A fifth conductive semiconductor layer such as a P type semiconductor layer having a polarity opposite to that of an N type of the second conductive semiconductor layer 105 may be formed under the first conductive semiconductor layer 130. In other words, the first conductive semiconductor layer 130 and the fifth conductive semiconductor layer may include a P type semiconductor layer, and the second conductive semiconductor layer 105 may include an N type semiconductor layer, but the embodiment is not limited thereto. Accordingly, the light emitting structure 135 may include at least one of an N-P junction structure, a P-N junction structure, an N-P-N junction structure, and a P-N-P junction structure. The following description will be made in that the first conductive semiconductor layer 130 is disposed on the lowermost layer of the light emitting structure 135.

The active layer 120 may be formed between the first conductive semiconductor layer 130 and the second conductive semiconductor layer 105. The active layer 120 may have a single quantum well structure, or a multiple quantum well structure. The active layer 120 may have a quantum wire structure or a quantum dot structure.

The active layer 120 may be formed at the periodicity of a well layer and a barrier layer by using a group II-VI compound semiconductor material, or a group III-V compound semiconductor material. The well layer may include a semiconductor layer having a compositional formula of $In_xAl_yGa_{1-x-y}N$ ($0 \leq x \leq 1$, $0 \leq y \leq 1$, and $0 \leq x+y \leq 1$), and the barrier layer may include a semiconductor layer having a compositional formula of $In_xAl_yGa_{1-x-y}N$ ($0 \leq x \leq 1$, $0 \leq y \leq 1$, and $0 \leq x+y \leq 1$). The barrier layer may include a material having a bandgap higher than that of the well layer.

For instance, the active layer 120 may have at least one of the periodicity of InGaN/GaN, the periodicity of InGaN/AlGaN, and the periodicity of InGaN/InGaN.

A conductive clad layer may be formed on and/or under the active layer 120. The conductive clad layer may include a GaN-based semiconductor material, and the bandgap of the conductive clad layer may be higher than the bandgap of the barrier layer.

The second conductive semiconductor layer 105 may include a group II-VI compound semiconductor or a group III-V compound semiconductor including second conductive dopants. For instance, the second conductive semiconductor layer 105 may selectively include GaN, AlN, AlGaN, InGaN, InN, InAlGaN, AlInN, AlGaAs, GaP, GaAs, GaAsP, or AlGaInP. The second conductive semiconductor layer 105 may include a semiconductor layer having the compositional formula of $In_xAl_yGa_{1-x-y}N$ ($0 \leq x \leq 1$, $0 \leq y \leq 1$, and $0 \leq x+y \leq 1$). The second conductive semiconductor layer 105 may include an N type semiconductor layer, and the second conductive dopants include N type dopants such as Si, Ge, Sn, Se, and Te. The second conductive semiconductor layer 105 may include a single layer or multiple layers. If the second conductive semiconductor layer 105 includes the multiple layers, the second conductive semiconductor layer 105 includes a superlattice structure in which mutually-different semiconductor layers are alternately aligned with each other. The bottom surface of the second conductive semiconductor layer 105 may have the same area as that of the top surface of the active layer 120, but the embodiment is not limited thereto.

The top surface of the second conductive semiconductor layer 105 may have the light extraction structure 112, and the light extraction structure 112 may be formed by forming the top surface of the second conductive semiconductor layer 105 at a roughness pattern or a concave-convex pattern. The side surface shape of the roughness pattern or the concave-convex pattern may include at least one of a semispherical shape, a polygonal shape, a pyramid shape, a nano-prism shape. The roughness pattern or the concave-convex pattern may have the uniform or irregular size and the uniform or irregular interval. The light extraction structure 112 changes the critical angle of light incident onto the top surface of the second conductive semiconductor layer 105, thereby improving the light extraction efficiency. The light extraction structure 112 may be formed at the entire portion or a portion of the second conductive semiconductor layer 105, but the embodiment is not limited thereto.

The third semiconductor layer 140 may be interposed between the second conductive semiconductor layer 105 and the active layer 120. The third semiconductor layer 140 may be formed under the second conductive semiconductor layer 105 in order to protect the active layer 120 from etching when the etching process is performed in order to form the light extraction structure 112.

The fourth conductive semiconductor layer 110 may be interposed between the third semiconductor layer 140 and the active layer 120, or may not be interposed therebetween. In other words, the fourth conductive semiconductor layer 110 may have the thickness of about 500 nm to about 2 μm between the third semiconductor layer 140 and the active layer 120, but the embodiment is not limited thereto.

The third semiconductor layer 140 may contact the top surface of the active layer 120, or may be spaced apart from the active layer 120 while interposing the fourth conductive semiconductor layer 110 having the thickness of about 500 nm to about 2 μm between the third semiconductor layer 140 and the active layer 120.

If the third semiconductor layer 140 is spaced apart from the active layer 120 by the distance of at least 500 nm or less, that is, if the thickness of the fourth conductive semiconductor layer 110 is 500 nm or less, since the fourth conductive semiconductor layer 110 cannot sufficiently produce electrons, the electrons are not smoothly supplied to the active layer 120, so that the light efficiency may be degraded.

If the third semiconductor layer 140 is spaced apart from the active layer 120 by the distance of 2 μm or more, the fourth conductive semiconductor layer 110 interposed between the active layer 120 and the third semiconductor layer 140 has the thickness of about 2 μm. If the third semiconductor layer 140 is spaced apart from the active layer 120 by the distance of 2 μm or more, and the fourth conductive semiconductor layer 110 is formed between the active layer 120 and the third semiconductor layer 140, the light loss may occur due to the thick thickness of the fourth conductive semiconductor layer 110, and the light efficiency may be degraded due to the light loss.

The second conductive semiconductor layer 105 may be formed on the third semiconductor layer 140 and the fourth conductive semiconductor layer 140 may be formed under the third semiconductor layer 140, but the embodiment is not limited thereto.

When the top surface of the second conductive semiconductor layer 105 disposed on the third semiconductor layer 10 is etched in order to form the light extraction structure 112, the etching process is not performed any more due to the third semiconductor layer 140. Accordingly, the fourth conductive semiconductor layer 110 and the active layer 120 disposed under the third semiconductor layer 140 may be protected from the etching.

The third semiconductor layer 140 may have the thickness of about 20 nm to about 1 μm.

The third semiconductor layer 140 may include a semiconductor layer whose a top surface has a Ga-face. The third semiconductor layer 140 may include a group II-V compound semiconductor material or a group III-V compound semiconductor material.

The third semiconductor layer 140 may include dopants, or may not include the dopants.

The third semiconductor layer 140 may include a compound semiconductor material the same as that of the second conductive semiconductor layer 105 or the fourth conductive semiconductor layer 110, but the embodiment is not limited thereto.

At least one side surface of the light emitting structure 135 may be perpendicular to the bottom surface of the light emitting structure 135, or may be inclined with respect to the bottom surface of the light emitting structure 135.

The second insulating layer 190 may be formed on the light emitting structure 135. For instance, the second insulating layer 190 may be formed on at least the side surfaces and the top surface of the light emitting structure 135, thereby protecting the light emitting structure 135 from external foreign matters. For instance, the second insulating layer 190 may be formed only on the side surfaces of the light emitting structure 135.

The second insulating layer 190 may include a transmissive insulating material. For instance, the transmissive insulating material may include a material having a refractive index lower than 2.4 which is the refractive index of a group II-VI compound semiconductor layer or a group III-V compound semiconductor layer constituting the light emitting structure 135. As described above, since the refractive index of the second insulating layer 190 is lower than that of the light emitting structure 135, the light can be more easily extracted, so that the light extraction efficiency can be improved.

The second insulating layer 190 includes at least one selected from the group consisting of $SiO_2$, $SiO_x$, $SiO_xN_y$, $Si_3N_4$, $Al_2O_3$, and $TiO_2$, but the embodiment is not limited thereto.

The first electrode layer 150 may include at least one of a conductive layer 148, a reflective layer 152, and a diffusion layer 154. The first electrode layer 150 electrically connects the electrode 115 to the first conductive semiconductor layer 130.

The first electrode layer 150 may be disposed under the first conductive semiconductor layer 130.

The conductive layer 148 may be disposed under the first conductive semiconductor layer 130, and the reflective layer 152 may be disposed under the conductive layer 148.

The conductive layer 148 may includes at least one conductive material, and may include a single layer or multiple layers. The conductive layer 148 may make ohmic contact with the first conductive semiconductor layer 130. The conductive layer 148 may contact the bottom surface of the first conductive semiconductor layer 130 in the form of a layer or a pattern. The conductive material may include at least one of a metallic material, a metallic oxide material, and a metallic nitride material. For instance, the conductive layer 148 may include at least one of ITO, IZO, IZON, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh and Pd. In addition, the conductive layer 148 may include a single layer or multiple layers including Ag, Ni, Al, Rh, Pd, Ir, Ru, Mg, Zn, Pt, Au, or Hf, or the alloys of at least two of the materials.

The reflective layer 152 includes a metallic material. For instance, the reflective layer 152 may include a single layer or a plurality of layers including Ag, Ni, Al, Rh, Pd, Ir, Ru, Mg, Zn, Pt, Au, or Hf, or the alloys of at least two materials of the above materials.

The width of the conductive layer 148 and the reflective layer 152 is equal to or different from the width of the bottom surface of the light emitting structure 135.

The diffusion layer 154 may be disposed under the reflective layer 152. The diffusion layer 154 may include a metallic material representing superior electrical conductivity. For instance, the diffusion layer 154 may include Sn, Ga, In, Bi, Cu, Ni, Ag, Mo, Al, Au, Nb, W, Ti, Cr, Ta, Al, Pd, Pt, or Si, or the alloys of at least one selected from among the above materials. The diffusion layer 154 may serve as a current spreading layer. A contact part 154A of the diffusion layer 154 may be disposed more closely to the first conductive semiconductor layer 130 than a remaining region of the diffusion layer 154. A portion of the contact part 154A may contact a portion of the bottom surface of the first conductive semiconductor layer 130. A portion of the contact part 154A of the diffusion layer 154 extends outward from the side surface of the light emitting structure 135 to contact the bottom surface of the electrode 115. The contact part 154A of the diffusion layer 154 may contact one side surface of the conductive layer 148 and the reflective layer 152.

The electrode 115 may be locally disposed on a portion of the contact part 154A of the diffusion layer 154, and may be spaced apart from at least the side surface of the light emitting structure 135.

The electrode 115 may include a metallic material. In detail, the electrode 115 may include one of Cr, Ti, Al, In, Ta, Pd, Co, Ni, Si, Ge, Ag, Cu and Au, or at least one of the alloys of the above materials. The electrode 115 may include a single layer or multiple layers, but the embodiment is not limited thereto.

The electrode 115 is disposed on the first electrode layer 150 exposed to the side portion of the light emitting structure 135, so that the light emitting area may be more enlarged as compared with the case that the electrode 115 is formed on the light emitting structure 135, thereby improving the light emission efficiency.

The second electrode layer 174 may include a horizontal electrode 172 and at least one vertical electrode 173.

The horizontal electrode 172 may be disposed under the first electrode layer 150, and the vertical electrode 173 may protrude in a vertical direction from the horizontal electrode 172.

A recess may be formed through the first electrode layer 150, the first conductive semiconductor layer 130, and the active layer 120 so that a portion of the second conductive semiconductor layer 110 under the third semiconductor layer 140 is exposed.

The vertical electrode 173 may extend from the horizontal electrode 172 so that the vertical electrode 173 may be connected to the second conductive semiconductor layer 110 through the first electrode layer 150, the first conductive semiconductor layer 130, and the active layer 120.

In this case, the third semiconductor layer 140 may contact the top surface of the vertical electrode 173, or may be spaced apart from the top surface of the vertical electrode 173, but the embodiment is not limited thereto.

For instance, when the vertical electrode 173 makes ohmic contact with the third semiconductor layer 140, the third semiconductor layer 140 may contact the top surface of the vertical electrode 173. When the vertical electrode 173 does not make ohmic contact with the third semiconductor layer 140, that is, makes schottky contact with the third semiconductor layer 140, the third semiconductor layer 140 may be spaced apart from the top surface of the vertical electrode 173, but the embodiment is not limited thereto.

The vertical electrode 173 may make ohmic contact with the second conductive semiconductor layer 110. In this case, the top surface of the second conductive semiconductor layer 110 may have an N-face, and the bottom surface of the second conductive semiconductor layer 110 may have a Ga-face.

In general, the Ga-face represents the crystalline superior to that of the N-face, so that the Ga-face represents thermal stability superior to that of the N-face. In addition, the Ga-face represents the operating voltage characteristic superior to that of the N-face.

Accordingly, the vertical electrode 173 makes ohmic contact with the Ga-face of the bottom surface of the second conductive semiconductor layer 110, thereby obtaining a light emitting device capable of smoothly supplying current and representing superior thermal stability and the superior operating voltage characteristic.

The circumferential surface of the vertical electrode 173 may be perpendicular to the horizontal electrode or may be inclined with respect to the horizontal electrode 172, but the embodiment is not limited thereto.

When viewed from the top, the vertical electrode 173 may have the shape of a circle or the shape of a polygon.

The top surface of the vertical electrode 173 may be interposed between the top surface of the active layer 120 and the top surface of the second conductive semiconductor layer 110.

A boundary surface 113 contacting the vertical electrode 173 and the second conductive semiconductor layer 110 may have a flat structure or a concave-convex structure, but the embodiment is not limited thereto.

The second electrode layer 174 may include at least one of an ohmic contact layer and a reflective layer. The second electrode layer 174 may include at least one of a metallic material, a metallic oxide, and a metallic nitride. For instance, the second electrode layer 174 may include one layer or a plurality of layers including ITO, IZO, IZON, IZTO, IAZO, IGZO, IGTO, AZO, ATO, GZO, IrOx, RuOx, RuOx/ITO, Ni/IrOx/Au, Ni/IrOx/Au/ITO, Cr, Ti, Co, Ge, Cu, Ag, Ni, Al, Rh, Pd, Ir, Ru, Mg, Zn, Pt, Au, or Hf, and the alloys of at least two of the materials.

The first insulating layer 164 may include a horizontal insulating layer 162 and a vertical insulating layer 163.

The first insulating layer 164 may be surrounded by the second electrode layer 174, the first electrode layer 150, and the light emitting structure 135.

In detail, the horizontal insulating layer 162 may be disposed between the diffusion layer 154 of the first electrode layer 150 and the horizontal electrode 172 of the second electrode layer 174. The vertical insulating layer 163 may be disposed between the vertical electrode 173 and each of the diffusion layer 154, the reflective layer 152, the conductive layer 148, the first conductive semiconductor layer 130, the active layer 120, and the second conductive semiconductor layer 110.

The first insulating layer 164 may electrically insulate the second electrode layer 174 from the first electrode layer 150, the first conductive semiconductor layer 130, and the active layer 120. The first insulating layer 164 may include a material representing a superior electrical insulating characteristic. For instance, the first insulating layer 164 may include a material selected from the group consisting of $SiO_2$, $SiO_x$, $SiO_xN_y$, $Si_3N_4$, $Al_2O_3$, and $TiO_2$.

The adhesive layer 176 may be disposed under the second electrode layer 174. The support substrate 178 may be disposed under the adhesive layer 176.

The adhesive layer 176 may include at least one of a metallic layer and a conductive layer, and may include barrier metal and/or bonding metal. The adhesive layer 176 may include a material representing a superior adhesive property and superior conductivity. A material constituting the adhesive layer 176 may include at least one of Sn, Ga, In, Bi, Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2O, Cu—Zn, Cu—P, Ni—B, Ni—Mn—Pd, Ni—P, and Pd—Ni, but the embodiment is not limited thereto. The thickness of the adhesive layer 176 may be in the range of 5 μm to 9 μm, but the embodiment is not limited thereto.

The support substrate 178 may include a conductive material. The support substrate 178 serves as a base substrate or a conductive support member. The support substrate 178 may include at least one of copper (Cu), gold (Au), nickel (Ni), molybdenum (Mo), and copper-tungsten (Cu—W). The support substrate 178 may be realized in the form of a conductive sheet. The support substrate 178 may have the size of 30 μm to 300 μm, but the embodiment is not limited thereto.

The support substrate 178 may include an insulating substrate, and the insulating substrate includes sapphire ($Al_2O_3$) or zinc oxide. If the support substrate 178 is an insulating substrate, the support substrate 176 may be connected to the second electrode layer 174 and/or the adhesive layer 176 through the lateral connection electrode or a via structure after a conductive pad is disposed on the bottom surface of the support substrate 178.

FIGS. 11 to 17 are sectional views showing the manufacturing process of the light emitting device according to the second embodiment.

Figure 11:
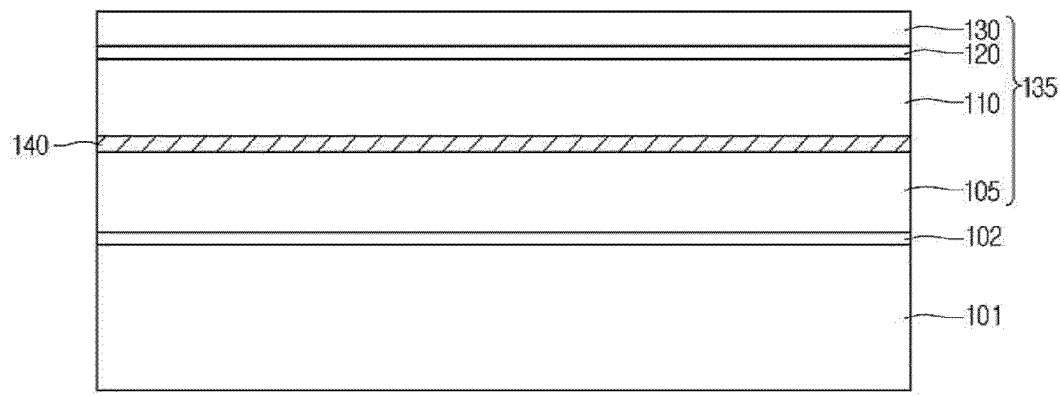
FIGS. 11 to 17 are sectional views showing the manufacturing process of the light emitting device according to the second embodiment.

Referring to FIG. 11, a growth substrate 101 is loaded on growth equipment, and then a layer or a pattern may be formed on the growth substrate 101 by using a group II-VI compound semiconductor or a group III-V compound semiconductor.

The growth equipment may be prepared through an E-beam evaporator, PVD (physical vapor deposition), CVD (chemical vapor deposition), PLD (plasma laser deposition), dual-type thermal evaporator, sputtering, or MOCVD (metal organic chemical vapor deposition). However, the embodiment is not limited to the above growth equipment.

The growth substrate 101 includes a conductive substrate or an insulating substrate. For instance, the growth substrate 101 may include one selected from the group consisting of a sapphire substrate ($Al_2O_3$), GaN, SiC, ZnO, Si, GaP, InP, $Ga_2O_3$, and GaAs. The growth substrate 101 is provided on the top surface thereof with a concave-convex pattern having a lens shape or a stripe shape. In addition, the growth substrate 101 is provided thereon with a buffer layer 102. The buffer layer 102 reduces the lattice constant difference between the growth substrate 101 and a nitride semiconductor layer. A material constituting the buffer layer 102 may include one selected from the group consisting of GaN, AlN, AlGaN, InGaN, InN, InAlGaN, AlInN, AlGaAs, GaP, GaAs, GaAsP, and AlGaInP. An undoped semiconductor layer may be interposed between the buffer layer 102 and the light emitting structure 135. The undoped semiconductor layer may include a GaN-based semiconductor that is not doped, and may include a semiconductor layer having conductivity lower than that of an N type semiconductor layer.

The second conductive semiconductor layer 105, the third semiconductor layer 140, the fourth conductive semiconductor layer 110, the active layer 120, and the first conductive semiconductor layer 130 may be sequentially grown on the buffer layer 102, thereby forming the light emitting structure 135.

Since the growing scheme of the layers 110, 140, 120, and 130 is the substantially same as that of the first embodiment, the details thereof will be omitted.

Figure 12:
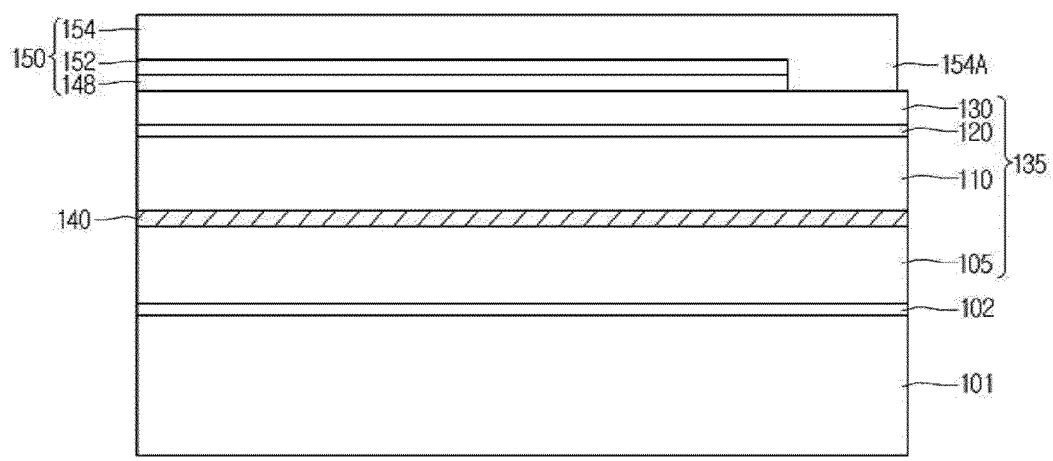

Referring to FIG. 12, the conductive layer 148 may be formed on the first conductive semiconductor layer 130. The conductive layer 148 may be formed through a sputtering scheme or a deposition scheme, but the embodiment is not limited thereto.

The conductive layer 148 may include a material representing an ohmic characteristic. The conductive layer 148 may make ohmic contact with the top surface of the first conductive semiconductor layer 130 and may be formed at a layer or at a plurality of patterns. The material constituting the conductive layer 148 may include at least one of a metallic material, a transmissive oxide material, and a transmissive nitride material. In addition, since an insulating material is additionally provided at a region between the conductive layer 148 and the first conductive semiconductor layer 130, the region may represent resistance higher than that of another region.

The conductive layer 148 is provided thereon with the reflective layer 152. The reflective layer 152 may include barrier metal or bonding metal. For instance, the reflective layer 152 may include at least one of Ti, Au, Sn, Ni, Cr, Ga, In, Bi, Cu, Ag and Ta, but the embodiment is not limited thereto.

The reflective layer 152 serves as a metallic layer, and may be formed through a sputtering scheme, a deposition scheme, a printing scheme, or a plating scheme, but the embodiment is not limited thereto.

The diffusion layer 154 is provided on the reflective layer 152 and serves as a metallic layer. The diffusion layer 152 may be formed through at least one of a plating scheme, a sputtering scheme, a deposition scheme, and a printing scheme. The reflective layer 152 may include one layer or a plurality of layers including the alloys of at least two of Ag, Ni, Al, Rh, Pd, Ir, Ru, Mg, Zn, Pt, Au, and Hf.

The contact part 154A of the diffusion layer 154 may contact the top surface of the first conductive semiconductor layer 130 through the side surfaces of the reflective layer 152 and the conductive layer 148. The contact part 154A of the diffusion layer 154 may be a portion of the first side surface of the light emitting structure 135, and may have the width of 100 μm or less.

The conductive layer 148, the reflective layer 152, and the diffusion layer 154 may constitute the first electrode layer 150.

Figure 13:
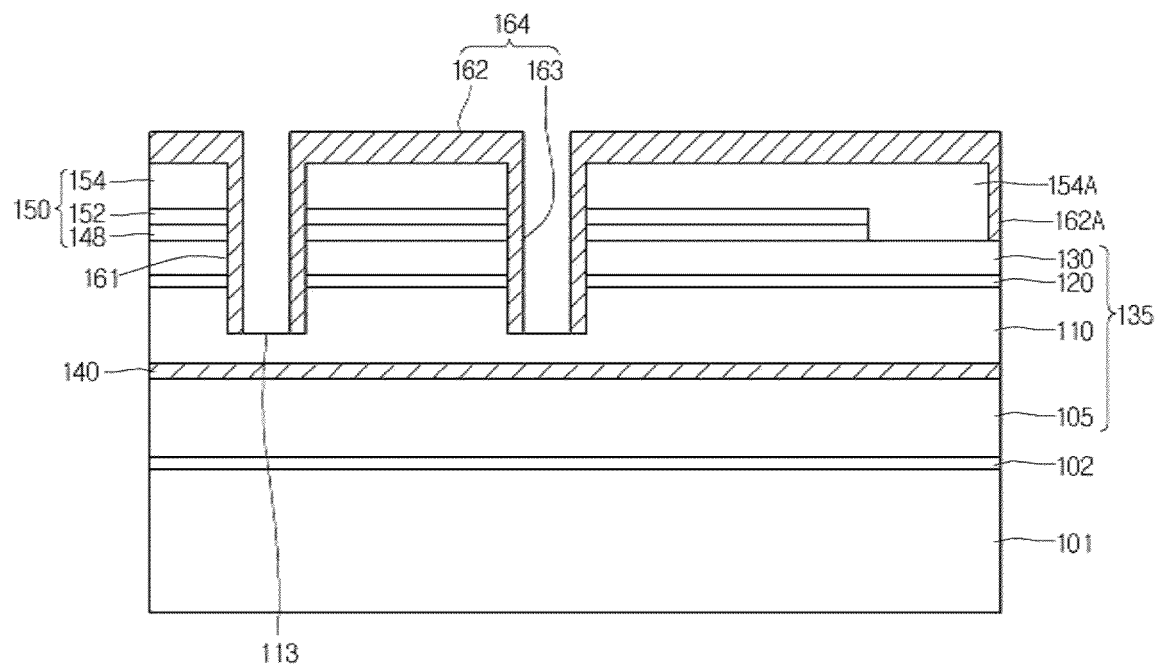

Referring to FIG. 13, at least one recess region 161 may be formed in the light emitting structure 135 and the first electrode layer 150. The depth of the recess region 161 may be formed to the extent of exposing a portion of the fourth conductive semiconductor layer 110. If a plurality of recess regions 161 are provided, the recess regions 161 may be spaced apart from each other. An exposed surface 113 of the fourth conductive semiconductor layer 110 has a Ga-face, and may have a flat surface or a concave-convex surface. The recess region 161 may be formed in a region without a mask layer through a laser, a drill, a dry etching scheme, or a wet etching scheme after the mask layer has been formed.

The first insulating layer 164 may be formed on the first electrode layer 150 and the recess region 161. The first insulating layer 164 is formed on the circumferential surface corresponding to both of the first electrode layer 150 of the recess region 161 and the light emitting structure 135. The portion 163 of the first insulating layer 64 may be filled in the recess region 161 and then perforated by using a drill, but the embodiment is not limited thereto.

A protective part 162A of the first insulating layer 164 may be formed on the side surface of the contact part 154A of the diffusion layer 154.

Figure 14:
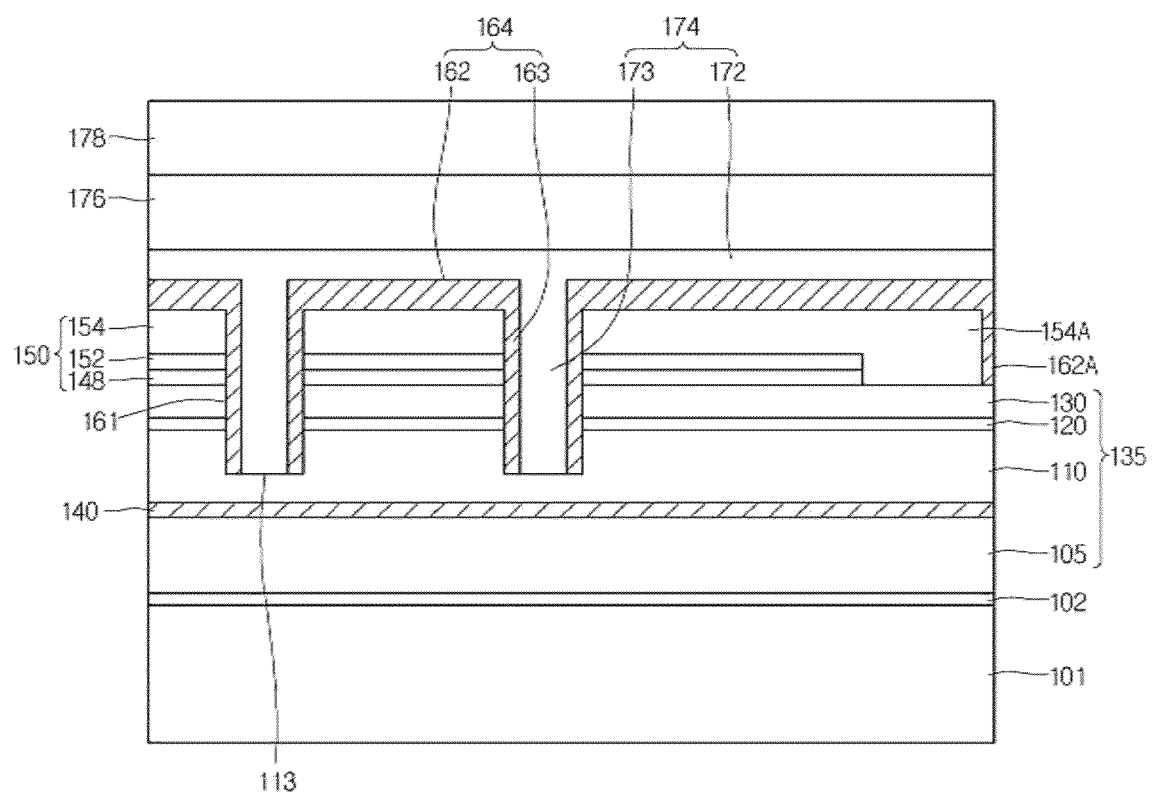

Referring to FIG. 14, the second electrode layer 174 may be formed on the first insulating layer 164 and the second electrode layer 174. The second electrode layer 174 may be filled in the recess region 161 while being disposed on the first insulating layer 164. The contact electrode 173 of the second electrode layer 174 makes ohmic contact with the surface 113 of the first conductive semiconductor layer 130.

The second electrode layer 174 may be formed through at least one of a sputtering scheme, a plating scheme, a deposition scheme, and a printing scheme. The second electrode layer 174 includes at least one of metal, a metallic nitride, and a metallic oxide. The adhesive layer 176 is disposed on the second electrode layer 174, and the support substrate 178 is disposed on the adhesive layer 176. The adhesive layer 176 may include barrier metal or bonding metal. For instance, the adhesive layer 176 may include at least one of Ti, Au, Sn, Ni, Cr, Ga, In, Bi, Cu, Ag and Ta. The adhesive layer 176 may include at least one of a deposition scheme, a sputtering scheme, and a plating scheme, or may be attached in the form of a conductive sheet. The thickness of the adhesive layer 176 may have the range of 5 μm to 9 μm, but the embodiment is not limited thereto.

The support substrate 178 may serve as a base substrate. The support substrate 178 may be realized by using at least one of Cu, Au, Ni, Mo, and Cu—W.

Figure 15:
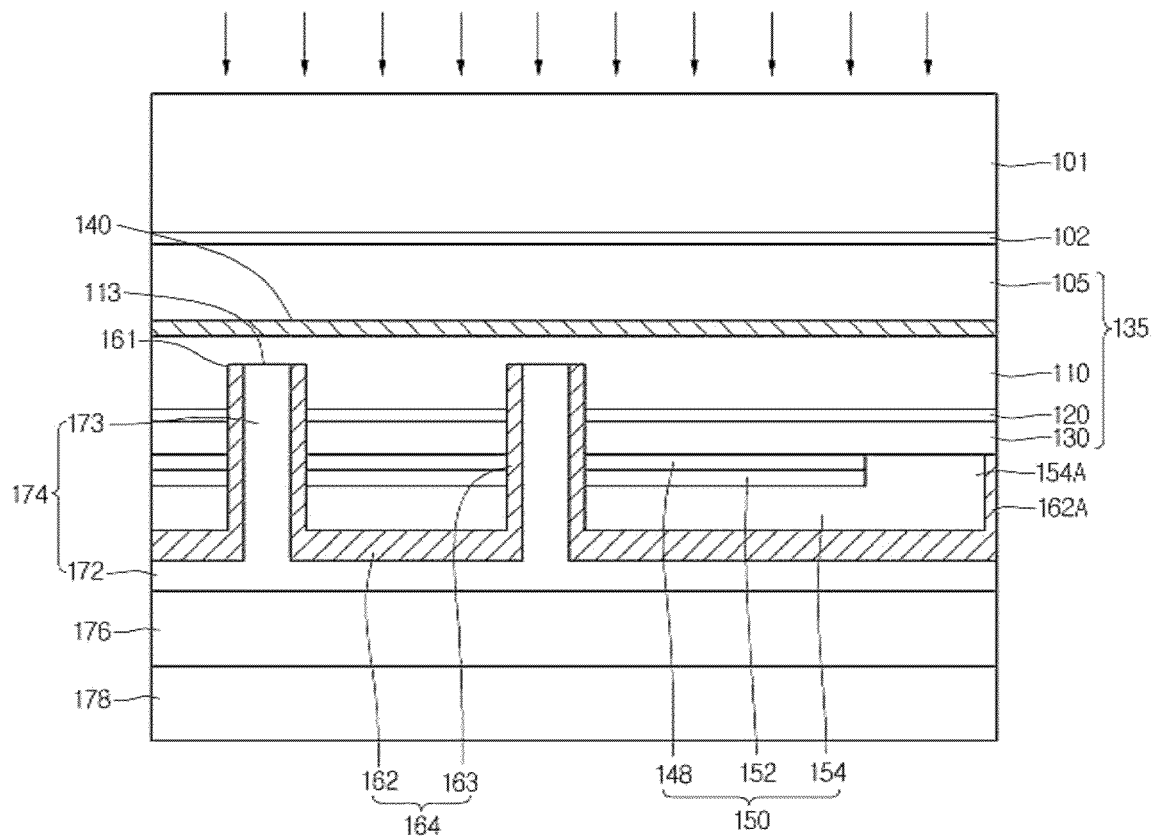

Referring to FIG. 15, the growth substrate 101 may be removed through a physical scheme and/or a chemical scheme. The growth substrate 101 may be removed by using a laser lift off (LLO) scheme. In other words, the growth substrate 101 is lifted off from the light emitting structure 135 by irradiating a laser beam having a specific wavelength onto the growth substrate 101. The growth substrate 101 may be lifted off from the light emitting structure 135 by removing the buffer layer 102 interposed between the growth substrate 101 and the second conductive semiconductor layer 105 using a wet etchant. The top surface of the second conductive semiconductor layer 105 may be exposed by removing the growth substrate 101 and then removing the buffer layer 102 through an etching scheme or a polishing scheme.

The top surface of the second conductive semiconductor layer 105 may be etched through an inductively-coupled plasma/reactive ion etching (ICP/RIE) scheme or may be polished using polishing equipment.

Figure 16:
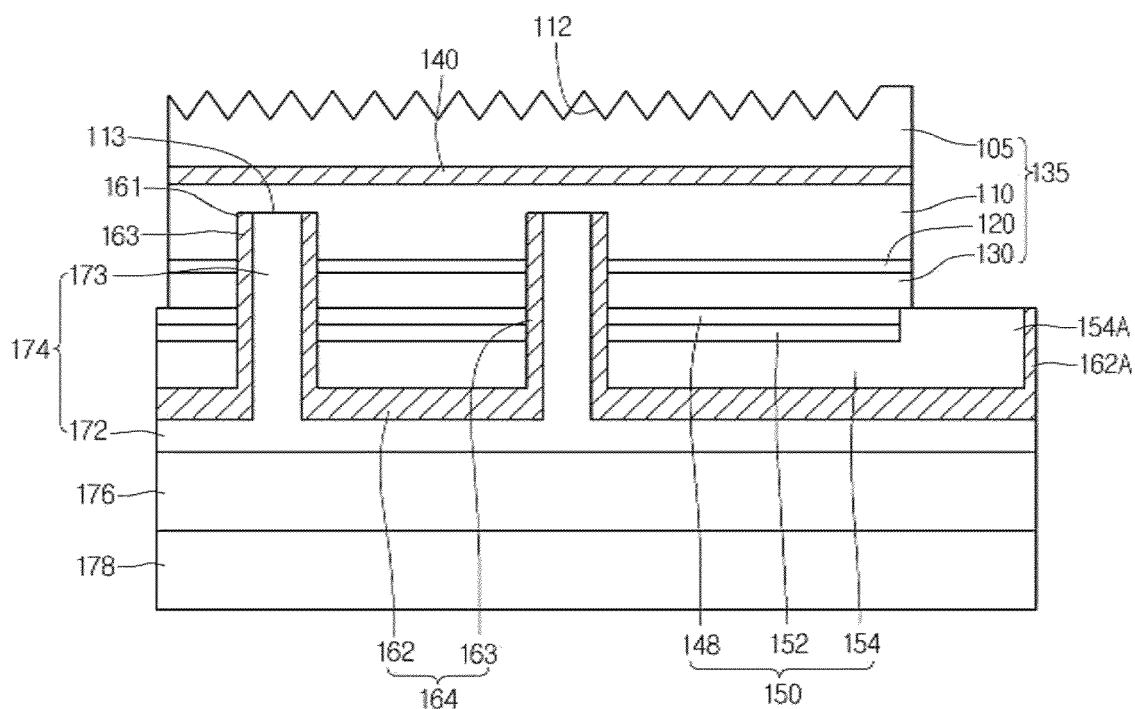

Referring to FIG. 16, a channel region or an isolation region, which is a peripheral region of the light emitting structure 135, that is, the boundary region between chips, may be removed, and the contact part 154A of the diffusion layer 154 is exposed by performing a first etching process. The first etching process includes a wet etching process and/or a dry etching process.

The light extraction structure 112 may be formed on the top surface of the second conductive semiconductor layer 105 by performing a second etching process. The light extraction structure 112 may be formed with a roughness or a pattern. The light emitting structure 112 may be formed through a wet etching scheme or a dry etching scheme.

The third semiconductor layer 140 is interposed between the second conductive semiconductor layer 105 and the active layer 120 so that the active layer 120 is not damaged as the second conductive semiconductor layer 105 is completely removed due to the over-etching through the second etching process. If the fourth conductive semiconductor layer 110 is formed, the third semiconductor layer 140 may be spaced apart from the active layer 120 by the thickness of the fourth conductive semiconductor layer 110. Accordingly, even if the over-etching is caused, only the second conductive semiconductor layer 105 formed on the third semiconductor layer 140 is removed, and the fourth conductive semiconductor layer 110 and the active layer 120 under the third semiconductor layer 140 are not damaged at all, so that the yield can be improved.

Meanwhile, the protective part 162A of the first insulating layer 164 is disposed in the channel region to protect the side surface of the light emitting structure 135 when chips are separated from each other.

Figure 17:
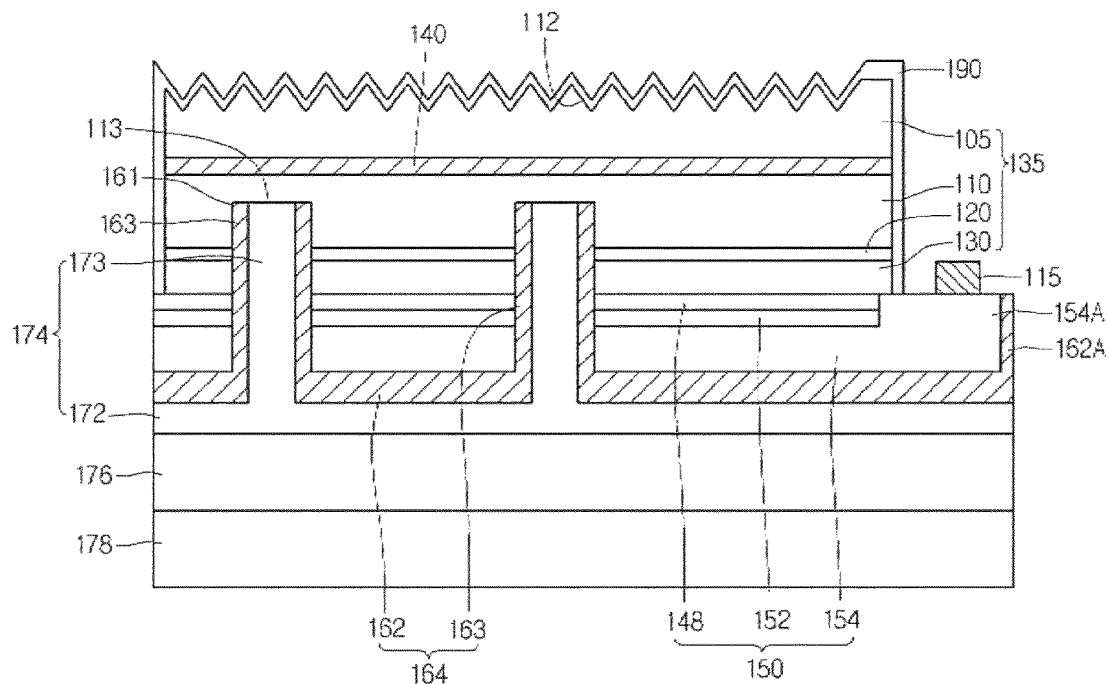

Referring to FIG. 17, the second insulating layer 190 is formed on the side surface and the top surface of the light emitting structure 135. The second insulating layer 190 is formed on the surface of the light emitting structure 135 to prevent the light emitting structure 135 from being exposed. The second insulating layer 190 may be formed through a sputtering scheme or a deposition scheme.

The second insulating layer 190 disposed on the light emitting structure 135 may have a roughness shape the same as that of the light emitting structure 112.

The electrode 115 is formed on the second insulating layer 190. The electrode 115 includes an electrode pattern, and contacts the contact part 154A of the diffusion layer 154 through a contact part 116. The contact part 116 of the electrode 115 may be connected to the contact part 154A of the diffusion layer 154 at the shortest interval through the side surface of the light emitting structure 135. The electrode 115 may be formed through a sputtering scheme, a plating scheme, or a deposition scheme, but the embodiment is not limited thereto.

The electrode 115 may be disposed at the edge portion of the light emitting structure 135. One electrode 115 or a plurality of electrodes 115 may be formed.

According to the first and second embodiments, another semiconductor layer serving as an etch stop layer is formed under a semiconductor layer having a light extraction structure, thereby preventing the yield from being lowered due to the damage of the active layer caused by the over-etching occurring when performing the etching process to form the light extraction structure.

Figure 18:
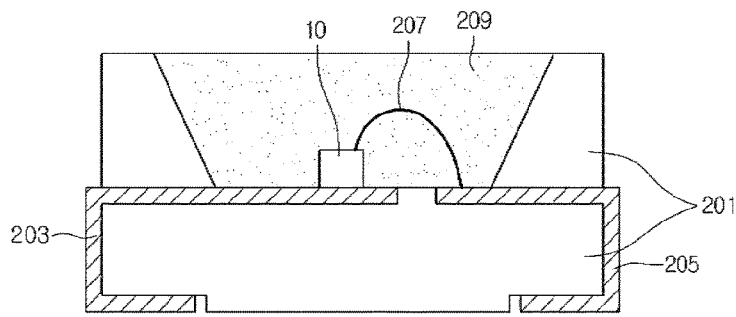
FIG. 18 is a sectional view showing a light emitting device package according to the embodiment.

FIG. 18 is a sectional view showing a light emitting device package according to the embodiment.

Referring to FIG. 18, a light emitting device package 200 includes a body 202, first and second electrode lines 203 and 205 installed in the body 202, the light emitting device 10 or 100 according to the embodiment, which is installed in the body 201 and electrically connected to the first and second electrode lines 203 and 205, and a molding member 209 surrounding the light emitting devices 10 and 100.

The body 201 may include a conductive substrate such as a silicon substrate, a synthetic resin material such as PPA, a ceramic substrate, an insulating substrate, or a metallic substrate (e.g., MCPCB). The body 201 may have an inclined surface due to the cavity structure around the light emitting device 10 or 100. The body 201 may have a concave cavity structure with an open upper portion, but the embodiment is not limited thereto.

The body 201 is provided therein with the first and second electrode lines 203 and 205 and the light emitting device 10 or 100. The body 201 may have a flat top surface.

The light emitting device 10 or 100 may be disposed on the first electrode line 203 and may be connected to the second electrode line 205 through a wire 207. The first and second electrode lines 203 and 205 are electrically insulated from each other to supply power to the light emitting device 10 or 100. In addition, the first and second electrode lines 203 and 205 may reflect the light generated from the light emitting device 10 or 100 to increase the light efficiency, and may discharge heat emitted from the light emitting device 10 or 100 to the outside.

The light emitting device 10 or 100 may be installed on the body 201 or installed on the first electrode line 203 or the second electrode line 205.

The light emitting device 10 or 100 is a device disclosed in the embodiment (embodiments), and may be bonded to the first and second electrode lines 203 and 205 by a solder.

The molding member 209 includes a resin material such as silicon or epoxy, and may protect the light emitting device 10 or 100 by surrounding the light emitting device 10 or 100. In addition, the molding member 209 may include a phosphor to shift the wavelength of light emitted from the light emitting device 10 or 100. The molding member 209 may be disposed thereon with an optical lens. The optical lens may contact the molding member 209 or may not contact the molding member 209. The optical lens may have a concave shape or a convex shape.

The light emitting device 10 or 100 may be electrically connected to the bottom surface of the body 201 or the substrate through a via.

The light emitting device package may be installed therein with at least one of the light emitting devices of the disclosed embodiments, but the embodiment is not limited thereto.

Although the light emitting device package according to the embodiment is shown in the top-view type, the light emitting device package may be realized in a side-view type, so that the heat radiation characteristic, conductivity, and a reflective characteristic can be improved. After packaging the top-view type or the side-view type light emitting device by using a resin layer as described above, the lens may be formed on the resin layer, or may be attached to the resin layer, but the embodiment is not limited thereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a first conductive semiconductor layer;
    an active layer on the first conductive semiconductor layer;
    a second conductive semiconductor layer on the active layer;
    a third semiconductor layer between the active layer and the second conductive semiconductor layer; and
    a light extraction structure on the second conductive semiconductor layer,
    wherein a top surface of the third semiconductor layer has a Ga-face, and
    wherein dopants of the third semiconductor layer have a polarity identical to a polarity of dopants of the second conductive semiconductor layer; and
    wherein a top surface of the second conductive semiconductor layer has an N-face.

2. The light emitting device of claim 1, wherein the third semiconductor layer contacts the active layer.

3. The light emitting device of claim 1, further comprising a fourth conductive semiconductor layer between the active layer and the third semiconductor layer.

4. The light emitting device of claim 3, wherein dopants of the fourth conductive semiconductor layer have a polarity different from a polarity of dopants of the first conductive semiconductor layer and identical to a polarity of dopants of the second conductive semiconductor layer.

5. The light emitting device of claim 3, wherein concentration of dopants of the third semiconductor layer is less than concentration of dopants of the fourth conductive semiconductor layer.

6. The light emitting device of claim 3, wherein the fourth conductive semiconductor layer has a thickness in a range of about 500 nm to about 2 μm.

7. The light emitting device of claim 3, further comprising:
    a first electrode layer under the first conductive semiconductor layer;
    an insulating layer under the first electrode layer; and
    a second electrode layer disposed under the insulating layer and electrically connected to the fourth conductive semiconductor layer.

8. The light emitting device of claim 7, wherein the second electrode layer contacts the fourth conductive semiconductor layer through both of the first conductive semiconductor layer and the active layer.

9. The light emitting device of claim 8, wherein the second electrode layer contacts the third semiconductor layer.

10. The light emitting device of claim 7, wherein the second electrode layer comprises:
    a horizontal electrode under the insulating layer; and
    at least one vertical electrode vertically protruding from the horizontal electrode, and
    wherein the at least one vertical electrode contacts the fourth conductive semiconductor layer.

11. The light emitting device of claim 1, wherein the third semiconductor layer has a thickness in a range of about 20 nm to about 1 μm.

12. The light emitting device of claim 1, further comprising:
    an electrode on the light extraction structure;
    an electrode layer under the first conductive semiconductor layer; and
    a protective layer at a peripheral region between the first conductive semiconductor layer and the electrode layer.

13. A light emitting device comprising:
    a support substrate;
    an electrode layer on the support substrate;
    a first conductive semiconductor layer on the electrode layer;
    an active layer on the first conductive semiconductor layer;
    a third semiconductor layer on the active layer;
    a second conductive semiconductor layer contacting the third semiconductor layer;

a fourth conductive semiconductor layer between the active layer and the third semiconductor layer;
a light extraction structure on the second conductive semiconductor layer; and
a protective layer at a peripheral region between the electrode layer and the first conductive semiconductor layer,
wherein a top surface of the third semiconductor layer has a Ga-face, and a top surface of the second conductive semiconductor layer has an N-face, and
wherein dopants of the fourth conductive semiconductor layer have a polarity different from a polarity of dopants of the first conductive semiconductor layer and identical to a polarity of dopants of the second conductive semiconductor layer.

14. A light emitting device comprising:
a support substrate;
an electrode layer on the support substrate;
a first conductive semiconductor layer on the electrode layer;
an active layer on the first conductive semiconductor layer;
a third semiconductor layer on the active layer;
a second conductive semiconductor layer contacting the third semiconductor layer;
a light extraction structure on the second conductive semiconductor layer; and
a protective layer at a peripheral region between the electrode layer and the first conductive semiconductor layer,
wherein a top surface of the third semiconductor layer has a Ga-face, and a top surface of the second conductive semiconductor layer has an N-face, and
wherein the third semiconductor layer contacts the active layer, and includes dopants having a polarity identical to a polarity of the second conductive semiconductor layer.

15. A light emitting device package comprising:
a body;
a light emitting device according to claim 1 and on the body; and
a molding member surrounding the light emitting device.

16. The light emitting device of claim 13, wherein the third semiconductor layer has no dopants.

17. The light emitting device of claim 13, wherein concentration of dopants of the third semiconductor layer is less than concentration of dopants of the fourth conductive semiconductor layer.

18. A light emitting device package comprising:
a body;
a light emitting device according to claim 13 and on the body; and
a molding member surrounding the light emitting device.

19. A light emitting device package comprising:
a body;
a light emitting device according to claim 14 and on the body; and
a molding member surrounding the light emitting device.

* * * * *